(12) United States Patent
Kim et al.

(10) Patent No.: US 12,004,413 B1
(45) Date of Patent: Jun. 4, 2024

(54) APPARATUS AND METHOD FOR MANUFACTURING A DISPLAY DEVICE

(71) Applicant: Samsung Display Co., Ltd., Yongin-si (KR)

(72) Inventors: Jeongkuk Kim, Yongin-si (KR); Heemin Park, Yongin-si (KR); Duckjung Lee, Yongin-si (KR); Sungsoon Im, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/479,202

(22) Filed: Oct. 2, 2023

(30) Foreign Application Priority Data

Mar. 24, 2023 (KR) .................. 10-2023-0038985
Apr. 21, 2023 (KR) .................. 10-2023-0052822

(51) Int. Cl.
*H10K 71/16* (2023.01)
*C23C 14/04* (2006.01)

(52) U.S. Cl.
CPC ......... *H10K 71/166* (2023.02); *C23C 14/042* (2013.01)

(58) Field of Classification Search
CPC .............................. H10K 7/166; C23C 14/042
See application file for complete search history.

(56) References Cited

U.S. PATENT DOCUMENTS

| 10,644,239 B2 | 5/2020 | Ghosh et al. |
| 11,631,813 B2 | 4/2023 | Moraes et al. |
| 2019/0198674 A1* | 6/2019 | Ozeki ............... H01L 29/78633 |

FOREIGN PATENT DOCUMENTS

| JP | 2005-294206 | 10/2005 |
| JP | 2022-525767 | 5/2022 |
| KR | 10-2021-0096891 | 8/2021 |

* cited by examiner

*Primary Examiner* — Joseph L Williams
(74) *Attorney, Agent, or Firm* — KILE PARK REED & HOUTTEMAN PLLC

(57) ABSTRACT

A method of manufacturing a display device includes arranging a display substrate in a chamber, arranging a mask assembly in the chamber, and supplying a deposition material to the mask assembly by a deposition source. The arranging of the mask assembly includes disposing a stopping layer including a stopping layer opening on a first mask layer, disposing an inorganic layer on the stopping layer, forming a first mask opening in the first mask layer, and forming an inorganic opening of the inorganic layer by etching the inorganic layer corresponding to the stopping layer opening.

12 Claims, 29 Drawing Sheets

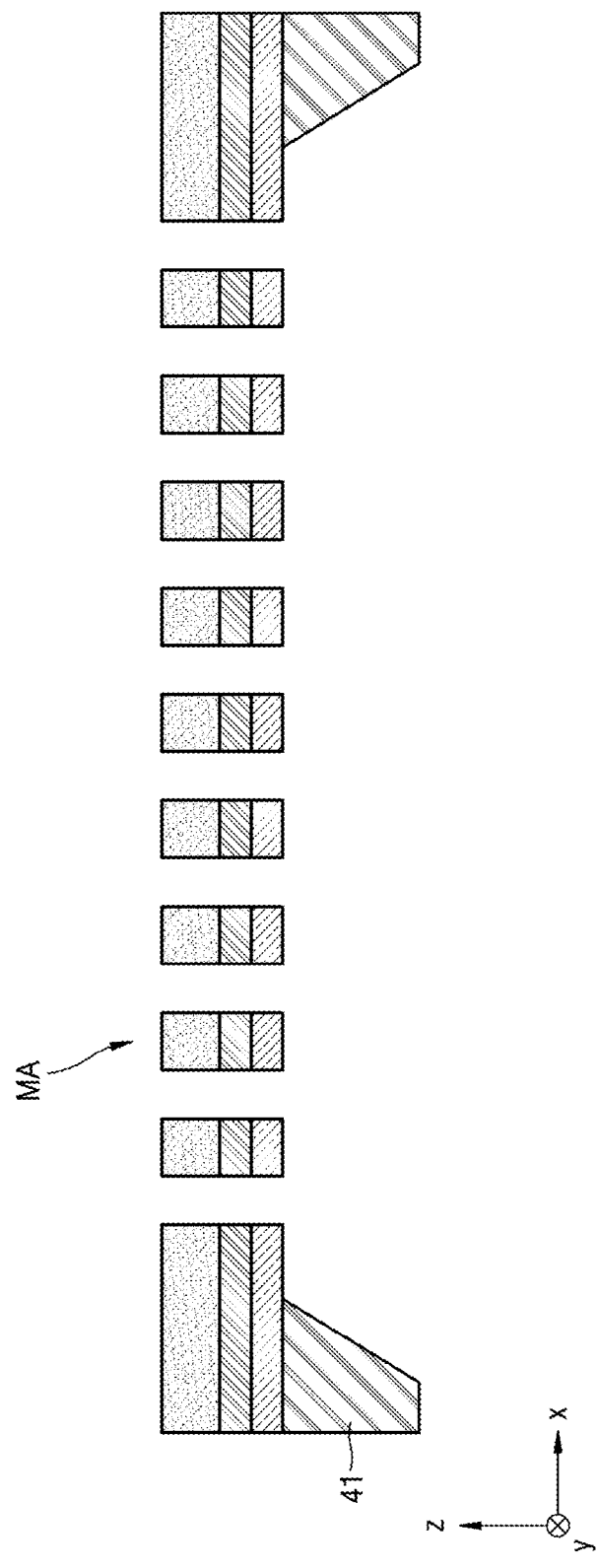

APPARATUS AND METHOD FOR MANUFACTURING A DISPLAY DEVICE

CROSS REFERENCE TO RELATED APPLICATION(S)

This application claims priority to and benefits of Korean Patent Application No. 10-2023-0038985 under 35 U.S.C. § 119, filed on Mar. 24, 2023, and Korean Patent Application No. 10-2023-0052822 under 35 U.S.C. § 119, filed on Apr. 21, 2023, in the Korean Intellectual Property Office (KIPO), the entire contents of which are incorporated herein by reference.

BACKGROUND

1. Technical Field

Embodiments relate to an apparatus for manufacturing a display device and a method of manufacturing the display device.

2. Description of the Related Art

Display devices are devices that display images in a visual manner. Display devices may provide images using light-emitting diodes. Display devices have been variously used. Accordingly, various designs to improve the quality of display devices have been attempted.

SUMMARY

The disclosure provides an apparatus and a method for manufacturing a display device including a mask assembly that can be manufactured in a simple process with improved durability and constant quality.

However, the technical goal is only an example, and technical goals to be achieved by the disclosure are not limited thereto.

Additional aspects will be set forth in part in the description which follows and, in part, will be apparent from the description, or may be learned by practice of embodiments of the disclosure.

According to an embodiment, a method of manufacturing a display device may include arranging a display substrate in a chamber, arranging a mask assembly in the chamber, and supplying a deposition material to the mask assembly by a deposition source. The arranging of the mask assembly may include disposing a stopping layer including a stopping layer opening on a first mask layer, disposing an inorganic layer on the stopping layer, forming a first mask opening in the first mask layer, and forming an inorganic opening of the inorganic layer by etching the inorganic layer corresponding to the stopping layer opening.

In an embodiment, in a plan view, a shape of the stopping layer opening formed in the stopping layer and a shape of an inorganic opening formed in the inorganic layer may be identical.

In an embodiment, the disposing of the inorganic layer may include disposing a first inorganic layer on the stopping layer, and disposing, on the first inorganic layer, a second inorganic layer having an etching selectivity ratio higher than an etching selectivity ratio of the first inorganic layer, and the etching of the inorganic layer may include etching the first inorganic layer corresponding to the stopping layer opening and etching the second inorganic layer corresponding to the stopping layer opening.

In an embodiment, the number of first inorganic openings formed in the first inorganic layer may correspond to the number of second inorganic openings formed in the second inorganic layer.

In an embodiment, in a plan view, a shape of the first inorganic openings formed in the first inorganic layer and a shape of the second inorganic openings formed in the second inorganic layer may be identical.

In an embodiment, the disposing of the stopping layer may include disposing, on the first mask layer, a first photoresist layer including a first photo opening, disposing the stopping layer on the first photoresist layer, and removing the first photoresist layer.

In an embodiment, the forming of the first mask opening may include disposing, under the first mask layer, a second photoresist layer including a second photo opening, etching the first mask layer corresponding to the second photo opening, and removing the second photoresist layer.

In an embodiment, the etching of the inorganic layer may be performed between the etching of the first mask layer and the removing of the second photoresist layer.

According to an embodiment, an apparatus for manufacturing a display device may include a chamber, a mask assembly arranged in the chamber and facing a display substrate, and a deposition source arranged in the chamber, facing the mask assembly, and supplying a deposition material that passes through the mask assembly and is deposited on the display substrate. The mask assembly may include a first mask layer including a first mask opening, a stopping layer disposed on the first mask layer and including a plurality of stopping layer openings corresponding to the first mask opening, and an inorganic layer disposed on the stopping layer and including a plurality of inorganic openings corresponding to the plurality of stopping layer openings, the inorganic layer may include a first inorganic layer, a second inorganic layer disposed on the first inorganic layer and having an etching selectivity ratio higher than an etching selectivity ratio of the first inorganic layer, and the plurality of inorganic openings may include a plurality of first inorganic openings arranged in the first inorganic layer and a plurality of second inorganic openings arranged in the second inorganic layer and corresponding to the plurality of first inorganic openings.

In an embodiment, the number of the plurality of first inorganic openings may correspond to the number of the plurality of second inorganic openings.

In an embodiment, in a plan view, a shape of the plurality of stopping layer openings and a shape of the plurality of inorganic openings may be identical.

In an embodiment, in a plan view, a shape of the plurality of first inorganic openings and a shape of the plurality of second inorganic openings may be identical.

Other aspects, features, and advantages effects in addition to those described above will be clearly understood from the drawings, claims, and detailed description.

BRIEF DESCRIPTION OF THE DRAWINGS

The above and other aspects, features, and advantages of embodiments of the disclosure will be more apparent from the following description taken in conjunction with the accompanying drawings, in which:

FIGS. 21 to 29 are schematic cross-sectional views of a mask assembly for illustrating a method of manufacturing a display device according to another embodiment.

DETAILED DESCRIPTION OF THE EMBODIMENTS

Figure 1:
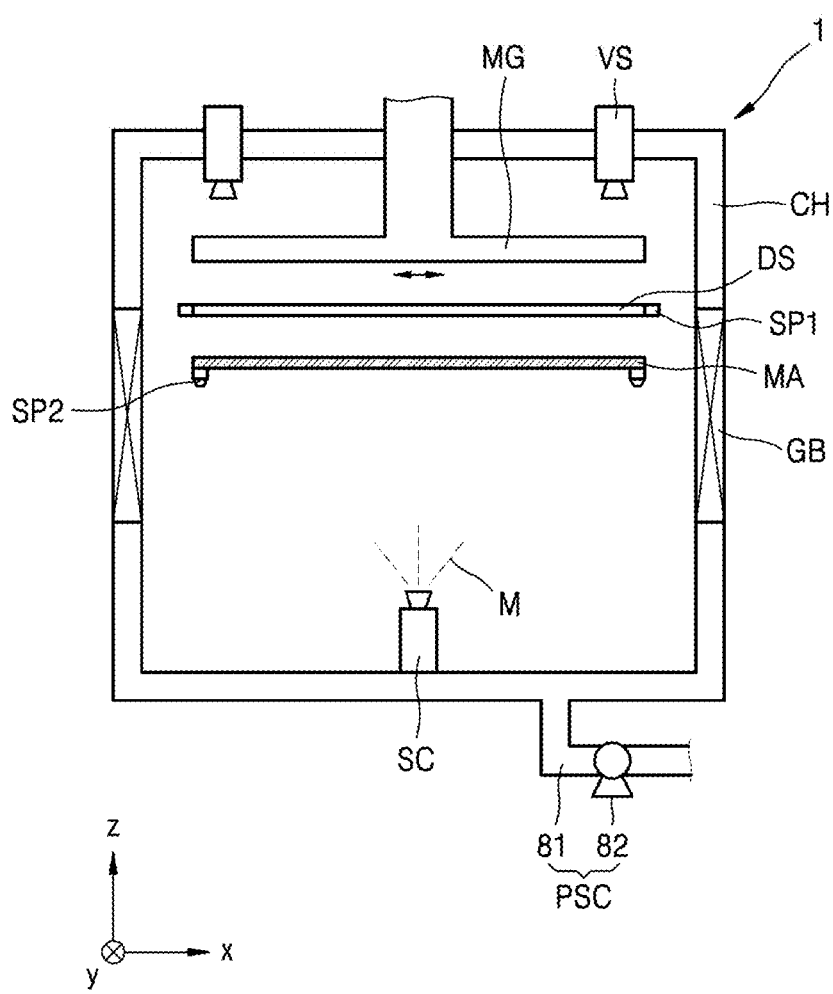
FIG. 1 is a schematic cross-sectional view illustrating an apparatus for manufacturing a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a and b" may be construed as a only, b only, or any combination of A and B. Also, "at least one of a, b, or c" indicates a only, b only, c only, both a and b, both a and c, both b and c, all of a, b, and c, or variations thereof.

As used herein, the terms "first," "second," etc. may be used herein to describe various types of elements. These terms are only used to distinguish one element from another, not in a limited sense. Thus, a first element discussed below could be termed a second element without departing from the teachings of the disclosure.

When a component is described herein to "connect" another component to the other component or to be "connected to" other components, the components may be connected to each other as separate elements, or the components may be integral with each other.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

Spatially relative terms, such as "under," "lower," "upper," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms are intended to encompass the plural forms as well, unless the context clearly indicates otherwise.

It will be further understood that the terms "comprise," "comprising," "include," "including," "have," "having," and the like, when used herein, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z axes, and may be interpreted in a broader sense. For example, the x-axis, the y-axis, and the z-axis may be perpendicular to one another, or may represent different directions that are not perpendicular to one another.

In the following embodiments, when a portion such as a film, an area, a layer, a substrate, or a component is "on" or "above" another portion, the portion may be directly on the other portion, or other films, areas, layers, substrates, or components may be located therebetween. In contrast, when an element is referred to as being "directly on" another element, no intervening elements are present.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. In the drawings, the sizes of elements may be exaggerated or reduced for convenience of description or clarity and/or descriptive purposes. For example, since the size and thickness of each element is arbitrarily shown in the drawings for convenience of description, the disclosure is not necessarily limited to those illustrated.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

An x-axis, a y-axis, and a z-axis are not limited to three axes on an orthogonal coordinate system, and may be interpreted as a wide meaning including the same. For example, the x-axis, y-axis, and z-axis may be orthogonal to one another, but may also refer to different directions that are not orthogonal to one another.

The surface may be parallel to a surface defined by an x-axis direction and a y-axis direction. A normal direction of the surface may indicate a z-axis direction. In this specification, an expression of "when viewed from the top or in a plan view" may represent a case when viewed in the z-axis direction. Hereinafter, a top surface (or a front surface) and a bottom surface (or a rear surface) of each of layers or units may be distinguished by the z-axis direction. However, directions indicated by the x, y, z-axes directions may be a relative concept, and converted with respect to each other, e.g., converted into opposite directions.

When some embodiments may be differently implemented, a particular process sequence may be performed differently from a sequence described. For example, two processes described in succession may be performed substantially simultaneously, or may be performed in an order opposite to an order described.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic cross-sectional view illustrating an apparatus 1 for manufacturing a display device according to an embodiment.

The apparatus 1 for manufacturing the display device may include a chamber CH, a first supporter SP1, a second supporter SP2, a mask assembly MA, a deposition source SC, a magnetic force part MG, a vision part VS, and a pressure adjuster PSC.

The chamber CH may include a space formed in the chamber CH, and may accommodate a display substrate DS and the mask assembly MA. A portion of the chamber CH may be open, and a gate valve GB may be arranged in the open portion of the chamber CH. The open portion of the chamber CH may be open or closed according to operations of the gate valve GB.

The display substrate DS may be a display substrate DS during manufacturing of the display device (see, e.g., 2 of FIG. 15), the display substrate DS on which at least one of an organic layer, an inorganic layer, and a metal layer on a substrate 100 described below is deposited. The display substrate DS may be a substrate 100 on which none of the organic layer, the inorganic layer, and the metal layer has been deposited.

The first supporter SP1 may support the display substrate DS. The first supporter SP1 may have a form of a plate fixed in the chamber CH. In another embodiment, the first supporter SP1 may have a form of a shuttle on which the display substrate DS is mounted and which may linearly move in the chamber CH. In another embodiment, the first supporter SP1 may include an electrostatic chuck, an adhesive chuck, or the like arranged in the chamber CH and fixed in the chamber CH or movable in the chamber CH.

The second supporter SP2 may support the mask assembly MA. The second supporter SP2 may be arranged in the chamber CH. The second supporter SP2 may adjust (e.g., finely adjust) a position of the mask assembly MA. The second supporter SP2 may include a separate driver, an aligning part, the like, or a combination thereof, such that the mask assembly MA may move in a separate direction.

In another embodiment, the second supporter SP2 may have a form of a shuttle, and the second supporter SP2 may be loaded with the mask assembly MA and may transfer the mask assembly MA. For example, the second supporter SP2 may move to an outside of the chamber CH, and may enter from the outside of the chamber CH into the chamber Ch after the mask assembly MA is loaded on the second supporter SP2.

In an embodiment, the first supporter SP1 and the second supporter SP2 may be integrally formed, and the first supporter SP1 and the second supporter SP2 may each include a movable shuttle or the like. The first supporter SP1 and the second supporter SP2 may include a structure in which the mask assembly MA and the display substrate DS are fixed in a state where the display substrate DS is loaded above (or on) the mask assembly MA, and may simultaneously linearly move the display substrate DS and the mask assembly MA.

For convenience of explanation, an embodiment in which the first supporter SP1 and the second supporter SP2 are separate from each other and arranged at different positions in the chamber CH will be mainly described below in detail.

The mask assembly MA may be arranged in the chamber CH and face the display substrate DS. A deposition material M may pass through the mask assembly MA and be deposited on the display substrate DS.

The deposition source SC may face the mask assembly MA and may provide the deposition material M to the mask assembly MA, and the deposition material M may pass through the mask assembly MA and be deposited on the display substrate DS. The deposition source SC may vaporize or sublimate the deposition material M by heating the deposition material M. The deposition source SC may be fixed in the chamber CH, or may be arranged in the chamber CH and linearly movable in a direction (e.g., an x-axis direction, a y-axis direction, or a z-axis direction).

The magnetic force part MG may be arranged in the chamber CH and face the display substrate DS and/or the mask assembly MA. The magnetic force part MG may apply a magnetic force to the mask assembly MA and push the mask assembly MA toward the display substrate DS.

The vision part VS may be arranged in the chamber CH and may detect (or identify) positions of the display substrate DS and the mask assembly MA. The vision part VS may include a camera that photographs the display substrate DS and the mask assembly MA. Based on images photographed by the vision part VS, the positions of the display substrate DS and the mask assembly MA may be identified, and deformation of the mask assembly MA may be confirmed. Based on the images, the position of the display substrate DS in the first supporter SP1 or the position of the mask assembly MA on the second supporter SP2 may be adjusted (e.g., be finely adjusted). Hereinafter, an embodiment in which the positions of the display substrate DS and the mask assembly MA are aligned by finely adjusting the position of the mask assembly MA on the second supporter SP2 will be described below in detail.

The pressure adjuster PSC may be connected to the chamber CH and adjust a pressure in the chamber CH. For example, the pressure adjuster PSC may adjust the pressure in the chamber CH to be substantially identical or similar to an atmospheric pressure. The pressure adjuster PSC may adjust the pressure in the chamber CH to be substantially identical or similar to a vacuum state.

The pressure adjuster PSC may include a connection pipe 81 connected to the chamber CH and a pump 82 arranged on the connection pipe 81. According to operations of the pump 82, external air may be introduced into the chamber CH through the connection pipe 81, or air in the chamber CH may be exhausted to an outside through the connection pipe 81.

According to a method of manufacturing a display device (not shown) using the apparatus 1 for manufacturing the display device as described above, the display substrate DS may be provided.

The pressure adjuster PSC may maintain the pressure inside the chamber CH substantially identical or similar to the atmospheric pressure, and the gate valve GB may open the open portion of the chamber CH.

The display substrate DS may be moved from outside the chamber CH into the chamber CH. The display substrate DS may be moved into the chamber CH with various methods. For example, the display substrate DS may be moved from the outside of the chamber CH into the chamber CH by a robot arm or the like arranged outside the chamber CH. In another embodiment, in case that the first supporter SP1 is formed in the form of a shuttle, the first supporter SP1 may be moved from inside of the chamber CH to the outside of the chamber CH, the display substrate DS may be mounted on the first supporter SP1 by a robot arm or the like arranged outside the chamber CH, and the first supporter SP1 may be moved from the outside of the chamber CH into the chamber CH.

The mask assembly MA may be moved into the chamber CH. In an embodiment, the mask assembly MA may be moved from the outside of the chamber CH to the inside of the chamber CH with a substantially identical or similar method as described with reference to the display substrate DS.

In case that the display substrate DS is moved into the chamber CH, the display substrate DS may be mounted on the first supporter SP1. The vision part VS may detect the positions of the display substrate DS and the mask assembly MA. The positions of the display substrate DS and the mask assembly MA may be identified based on the images photographed by the vision part VS. In an embodiment, a separate controller (not shown) may be provided in the apparatus 1 for manufacturing the display device to identify the positions of the display substrate DS and the mask assembly MA.

In case that the positions of the display substrate DS and the mask assembly MA are identified (e.g., completely identified), the second supporter SP2 may adjust (e.g., finely adjust) the position of the mask assembly MA.

The deposition source SC may provide the deposition material M to the mask assembly MA, and the deposition material M that has passed through the mask assembly MA may be deposited on the display substrate DS. The deposition source SC may move in parallel with respect to the display substrate DS and the mask assembly MA, or the display substrate DS and the mask assembly MA may move in parallel with respect to the deposition source SC. The deposition source SC may move relative to the display substrate DS and the mask assembly MA. The pump 82 may suck the air in the chamber CH, discharge the air to the outside, and maintain the pressure in the chamber CH to be substantially identical or similar to a vacuum state.

The deposition material M provided from the deposition source SC may pass through the mask assembly MA and be deposited on the display substrate DS, and by depositing the deposition material M on the display substrate DS, at least one of multiple layers such as an organic layer, an inorganic layer, a metal layer, the like, or a combination thereof to be stacked on the display device may be formed.

Figure 2:
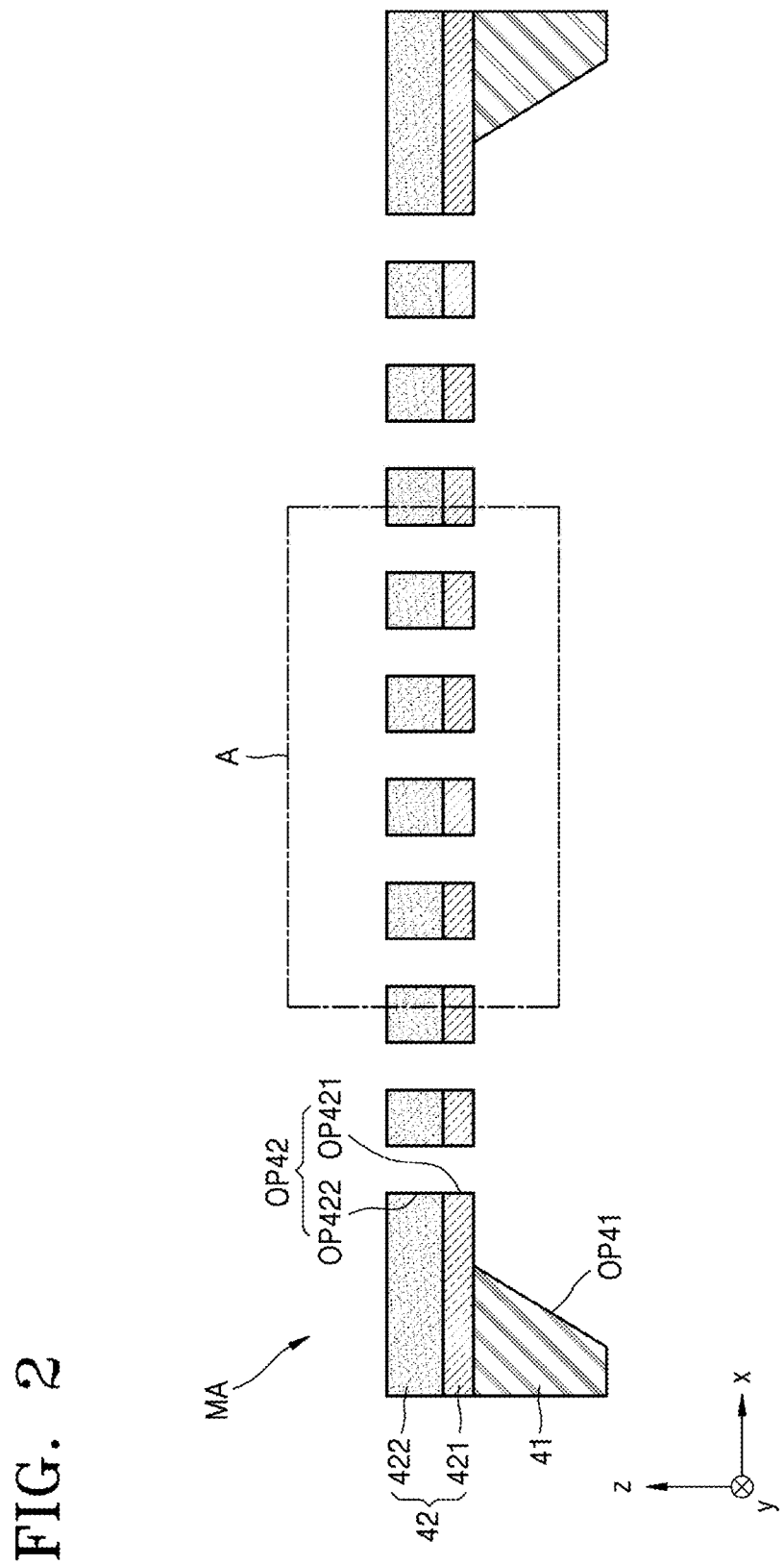
FIG. 2 is a schematic cross-sectional view illustrating a mask assembly according to an embodiment.
Figure 3:
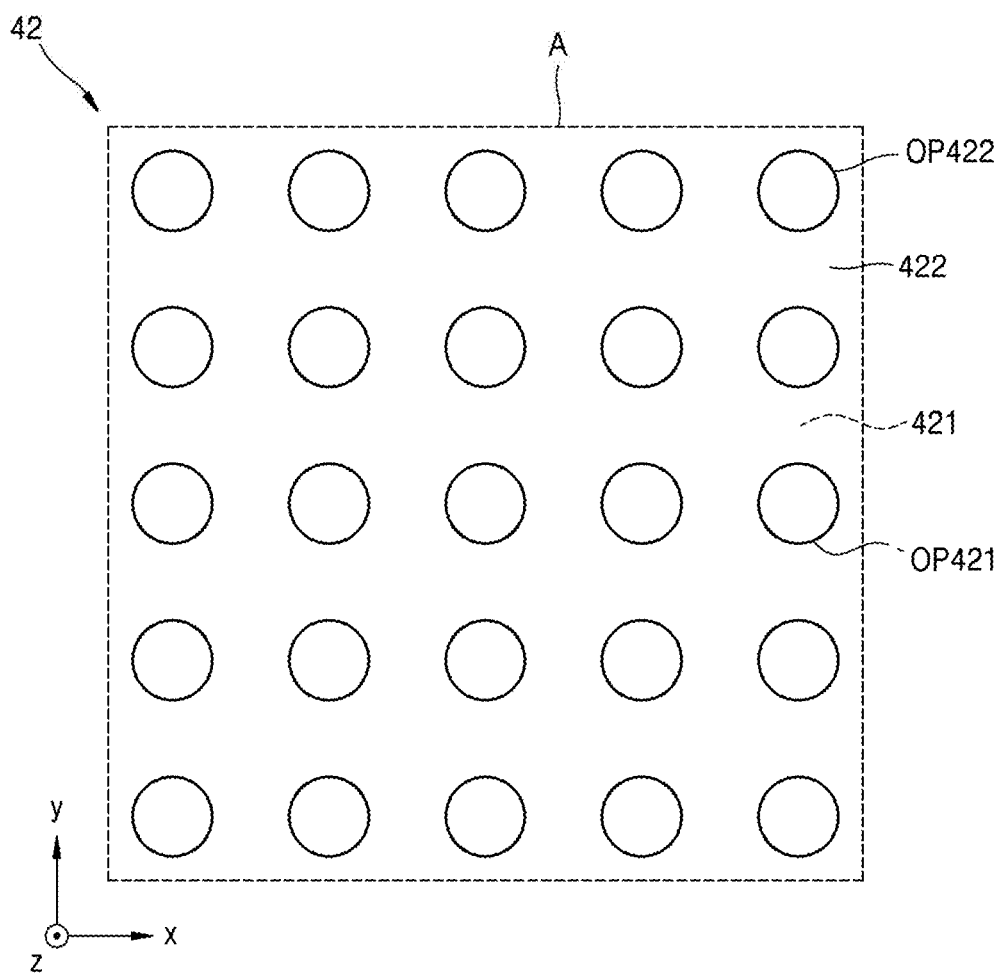
FIG. 3 is a schematic plan view illustrating a portion of a second mask layer according to an embodiment.

FIG. 2 is a schematic cross-sectional view illustrating the mask assembly MA according to an embodiment; and FIG. 3 is a schematic plan view illustrating a portion of a second mask layer 42 according to an embodiment. FIG. 3 is a schematic diagram of portion A of FIG. 2 in a plan view.

Referring to FIGS. 2 and 3, the mask assembly MA may include a first mask layer 41 and the second mask layer 42.

The first mask layer 41 may support the second mask layer 42. The first mask layer 41 may include a first mask opening OP41. The first mask opening OP41 may be arranged (or formed) in the first mask layer 41 to pass the deposition material (see, e.g., M of FIG. 1). An inner circumferential surface may be formed in the first mask layer 41 by the first mask opening OP41. The first mask opening OP41 may be arranged in a portion (e.g., a center portion) of the first mask layer 41. A portion (e.g., a center portion) of the second mask layer 42 may be exposed through the first mask opening OP41 of the first mask layer 41. Although FIG. 2 illustrates that the inner circumferential surface of the first mask layer 41 inclines with respect to the second mask layer 42 in a cross-sectional view, the disclosure is not limited thereto, and the inner circumferential surface of the first mask layer 41 may be perpendicular to the second mask layer 42.

The first mask layer 41 may include a silicon-based material. For example, the first mask layer 41 may include at least one of silicon oxide ($SiO_x$), silicon nitride ($SiN_x$), and silicon oxynitride ($SiO_xN_y$).

The second mask layer 42 may be disposed on the first mask layer 41. The second mask layer 42 may include a second mask opening OP42. The second mask opening OP42 may be arranged (or formed) in the second mask layer 42 to pass the deposition material (see, e.g., M of FIG. 1). The second mask opening OP42 may overlap the first mask opening OP41 in a plan view. The second mask 42 may include multiple second mask openings OP42. For example, as shown in FIG. 3, multiple second mask openings OP42 may be arranged in a first direction (e.g., an x-axis direction) and a second direction (e.g., a y-axis direction). The second mask layer 42 may include a stopping layer 421 and an inorganic layer 422.

The stopping layer 421 may be disposed on the first mask layer 41. The stopping layer 421 may include an oxide-based material. For example, the stopping layer 421 may include an Zn-oxide-based material such as Zn oxide, In—Zn oxide, Ga—In—Zn oxide, the like, or a combination thereof. In embodiments, the stopping layer 421 may include In-Ga—Zn-O (IGZO), In—Sn—Zn—O (ITZO), InGa—Sn—Zn—O (IGTZO), the like, or a combination thereof which includes a metal such as indium (In), gallium (Ga), tin (Sn), and the like (in addition to ZnO).

The inorganic layer 422 may be disposed on the stopping layer 421. For example, the inorganic layer 422 may include at least one of $SiO_x$, $SiN_x$, and $SiO_xN_y$.

The second mask opening OP42 may include a stopping layer opening OP421 and an inorganic opening OP422. The stopping layer opening OP421 may be arranged (or formed) in the stopping layer 421, and the inorganic opening OP422 may be arranged (or formed) in the inorganic layer 422. The stopping layer opening OP421 and the inorganic opening OP422 may overlap each other in a plan view. Therefore, the deposition material (see, e.g., M of FIG. 1) may pass sequentially through the stopping layer opening OP421 and the inorganic opening OP422. For example, in a plan view, shapes of the stopping layer opening OP421 and the inorganic opening OP422 may be substantially identical to each other. In a cross-sectional view, a width of the stopping layer opening OP421 and a width of the inorganic opening OP422 may be substantially identical to each other.

FIGS. 4 to 14 are schematic cross-sectional views of the mask assembly MA for illustrating a method of manufacturing the display device according to an embodiment.

In FIGS. 4 to 14, same reference numerals as those of FIGS. 1 to 3 indicate same members, and description thereof will not be repeatedly given.

Referring to FIGS. 4 to 14, the method of manufacturing the display device may include arranging the mask assembly MA in the chamber (see, e.g., CH of FIG. 1).

The arranging of the mask assembly MA may include disposing the stopping layer 421 in which the stopping layer opening OP421 is arranged, on the first mask layer 41, disposing the inorganic layer 422 on the stopping layer 421, forming the first mask opening OP41 in the first mask layer 41, and etching the inorganic layer 422 to form the stopping layer opening OP421.

FIGS. 4 to 7 illustrate the disposing of the stopping layer 421 in which the stopping opening OP421 is arranged, on the first mask layer 41.

Figure 4:
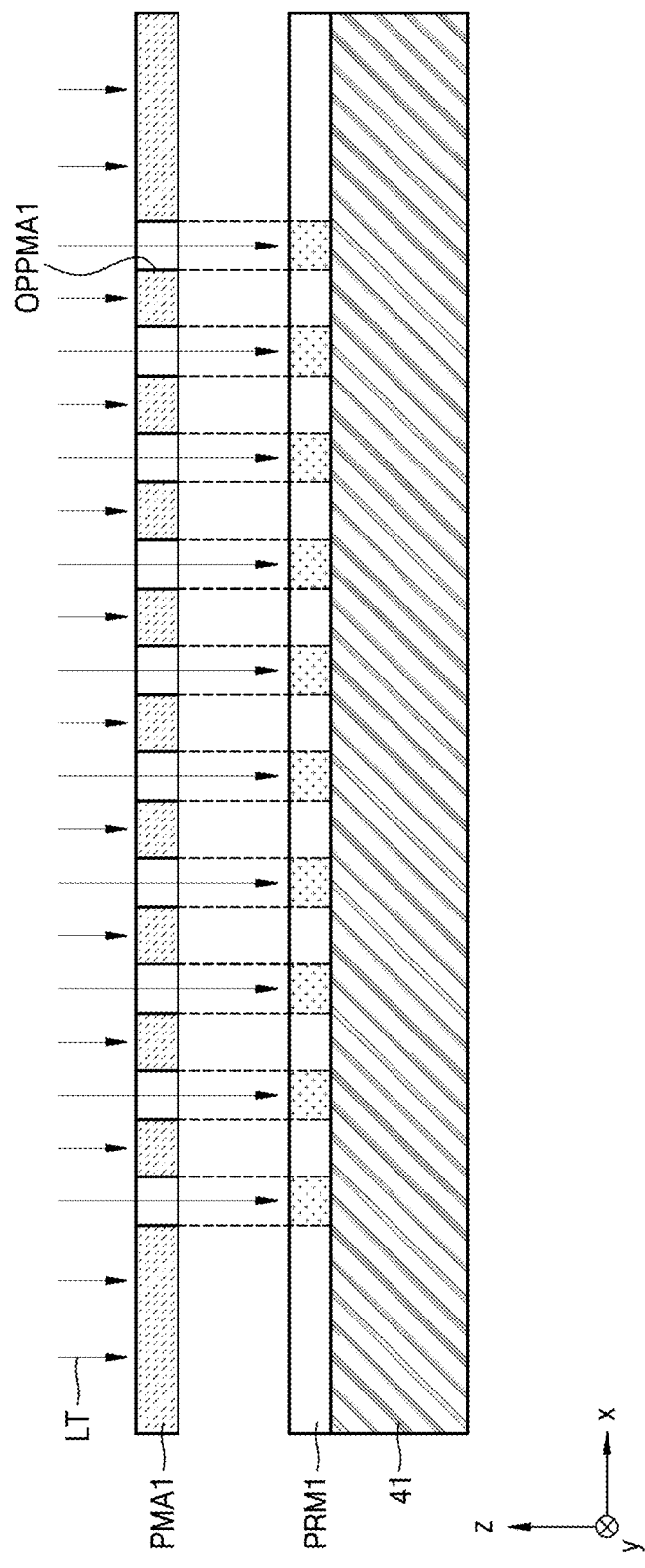
FIGS. 4 to 14 are schematic cross-sectional views of a mask assembly for illustrating a method of manufacturing a display device according to an embodiment.
Figure 5:
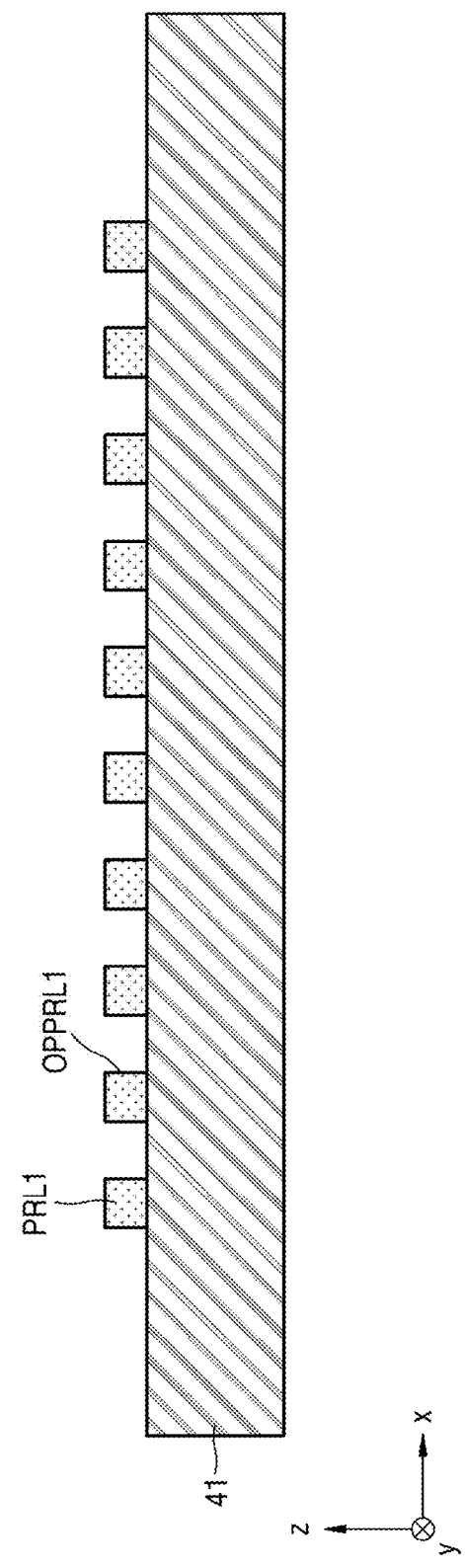

Referring to FIGS. 4 and 5, the disposing of the stopping layer 421 in which the stopping layer opening OP421 is arranged, on the first mask layer 41, may include disposing a first photoresist layer PRL1 in which a first photo opening OPPRL1 is arranged, on the first mask layer 41.

Referring to FIG. 4, a first photoresist material PRM1 may be disposed on the first mask layer 41. The first photoresist material PRM1 may include a photosensitive material. A first photomask PMA1 that has been patterned may be disposed on the first photoresist material PRM1. The first photomask PMA1 may include multiple first photomask openings OPPMA1. The first photomask openings OPPMA1 may be arranged (or formed) in the first photomask PMA1. Light LT may be irradiated from a top of the first mask layer 41 toward the first photoresist material PRM1. For example, the light LT may be an ultraviolet ray or the like.

A portion of the light LT may penetrate (or pass through) the first photomask opening OPPMA1 and reach the first photoresist material PRM1, and another portion of the light LT may be blocked by the first photomask PMA1 and not reach the first photoresist material PRM1. A portion of the first photoresist material PRM1 overlapping the first photomask opening OPPMA1 in a plan view may be cured.

Referring to FIG. 5, a portion of the first photoresist material (see, e.g., PRM1 of FIG. 4) not overlapping the first photomask opening (see, e.g., OPPMA1 of FIG. 4) in a plan view and not cured may be removed. After removing of the portion of the first photoresist material (see, e.g., PRM1 of FIG. 4), the first photoresist layer PRL1 that has been patterned may be formed. The first photoresist layer PRL1 may include a first photo opening OPPRL1. The first photo opening OPPRL1 may be formed in the first photoresist layer PRL1.

Figure 6:
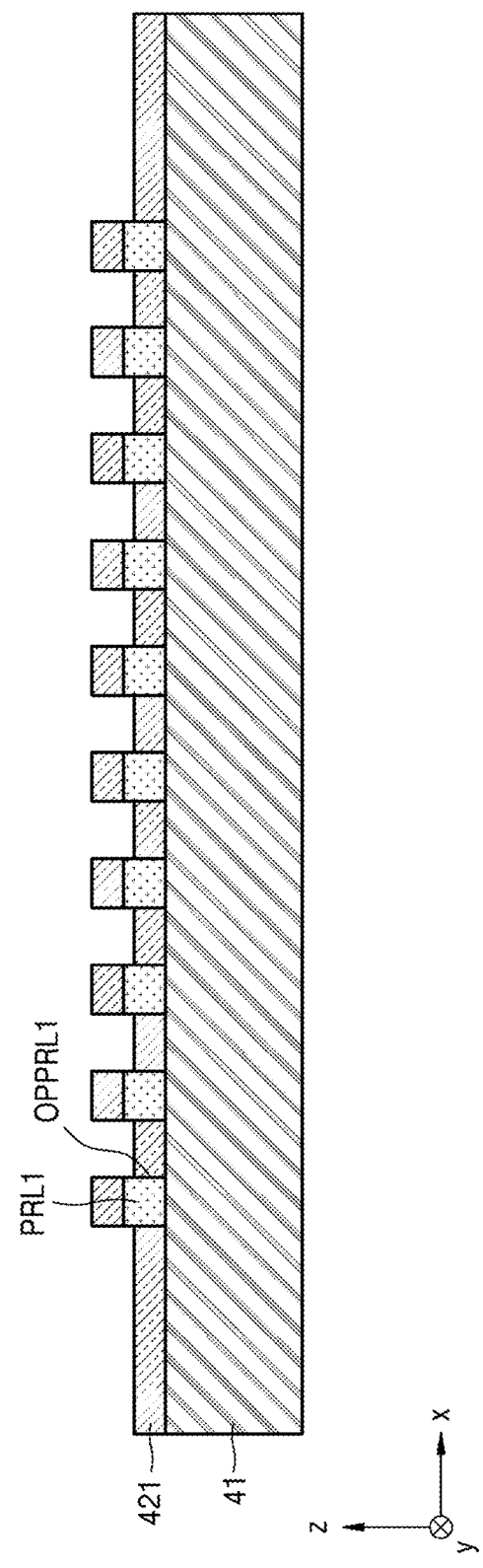
Figure 7:
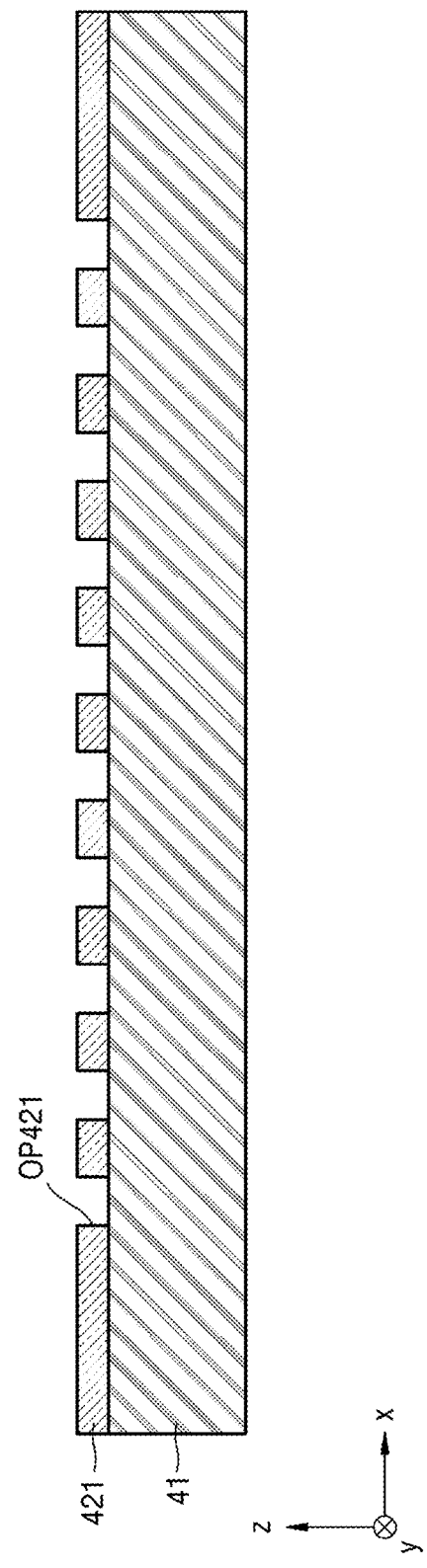

Referring to FIGS. 6 and 7, the disposing of the stopping layer 421 in which the stopping layer opening OP421 is arranged, on the first mask layer 41, may include disposing the stopping layer 421 on the first photoresist layer PRL1. A portion of the stopping layer 421 may be disposed on the first mask layer 41, and another portion of the stopping layer 421 may be disposed on the first photoresist layer PRL1. A portion of the stopping layer 421 may overlap the first photo opening OPPRL1 in a plan view, and another portion of the stopping layer 421 may not overlap the first photo opening OPPRL1 in a plan view.

A portion of the stopping layer 421 may be accommodated in the first photo opening OPPRL1 (or between the first photoresist layer PRL1). A portion of the stopping layer 421, which overlaps the first photo opening OPPRL1 in a plan view, may contact a top surface of the first mask layer 41, and another portion of the stopping layer 421, not overlapping the first photo opening OPPRL1 in a plan view, may contact a top surface of the first photoresist layer PRL1.

Referring to FIG. 7, the disposing of the stopping layer 421 in which the stopping layer opening OP421 is arranged, on the first mask layer 41, may include removing the first photoresist layer (see, e.g., PRL1 of FIG. 6). In a process of the removing of the first photoresist layer (see, e.g., PRL1 of FIG. 6), the portion of the stopping layer 421, which contacts the top surface of the first photoresist layer (see, e.g., PRL1 of FIG. 6), may be also removed. The portion of the stopping layer 421, which overlaps the first photo opening (see, e.g., OPPRL1 of FIG. 6) in a plan view, may be maintained without being removed. As a result, the stopping layer opening OP421 may be arranged in the stopping layer 421.

Figure 8:
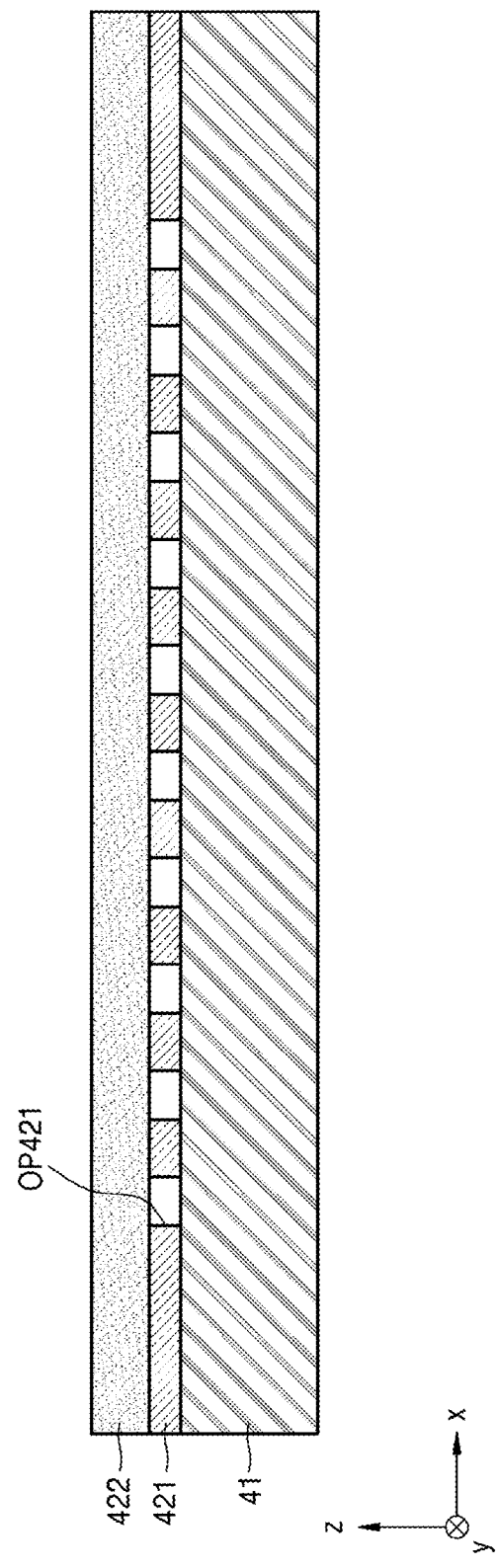

FIG. 8 illustrates the disposing of the inorganic layer 422 on the stopping layer 421. In a process of the disposing of the inorganic layer 422 on the stopping layer 421, the inorganic layer 422 may be disposed on the stopping layer 421, which is disposed on the first mask layer 41. Although FIG. 8 illustrates that the inorganic layer 422 is not formed in the stopping layer opening OP421, the disclosure is not limited thereto, and depending on physical properties of the inorganic layer 422, the inorganic layer 422 may be formed in the stopping layer opening OP421. A portion of the inorganic layer 422 may be disposed on the stopping layer 421, and another portion of the inorganic layer 422 may be disposed on the first mask layer 41.

FIGS. 9 to 12 illustrate the forming of the first mask opening OP41 in the first mask layer 41.

Figure 9:
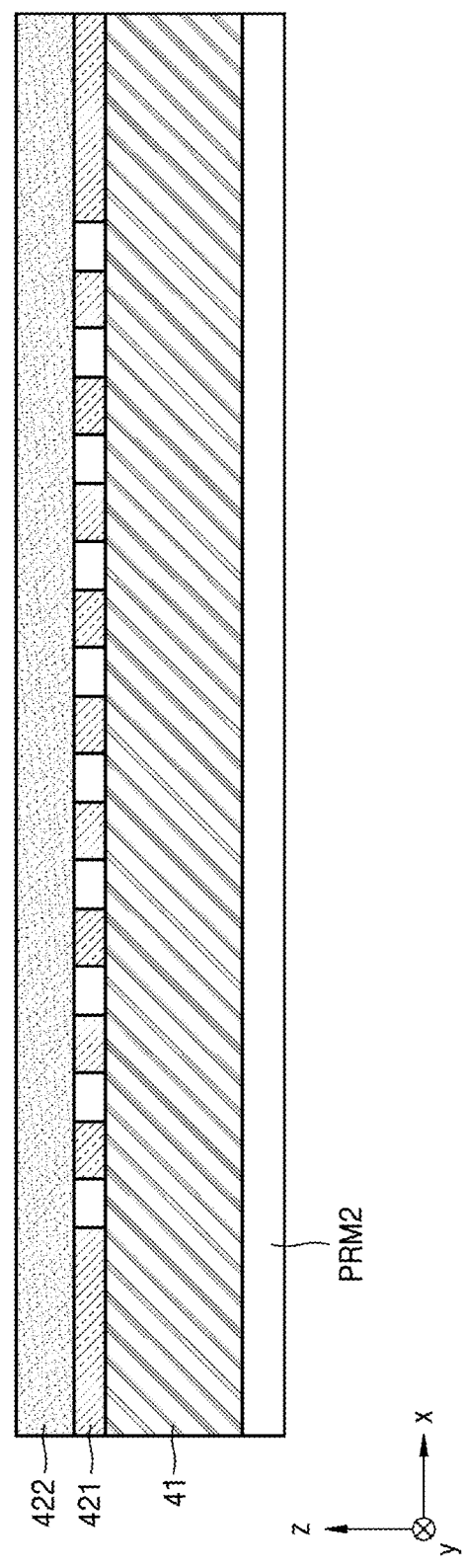
Figure 10:
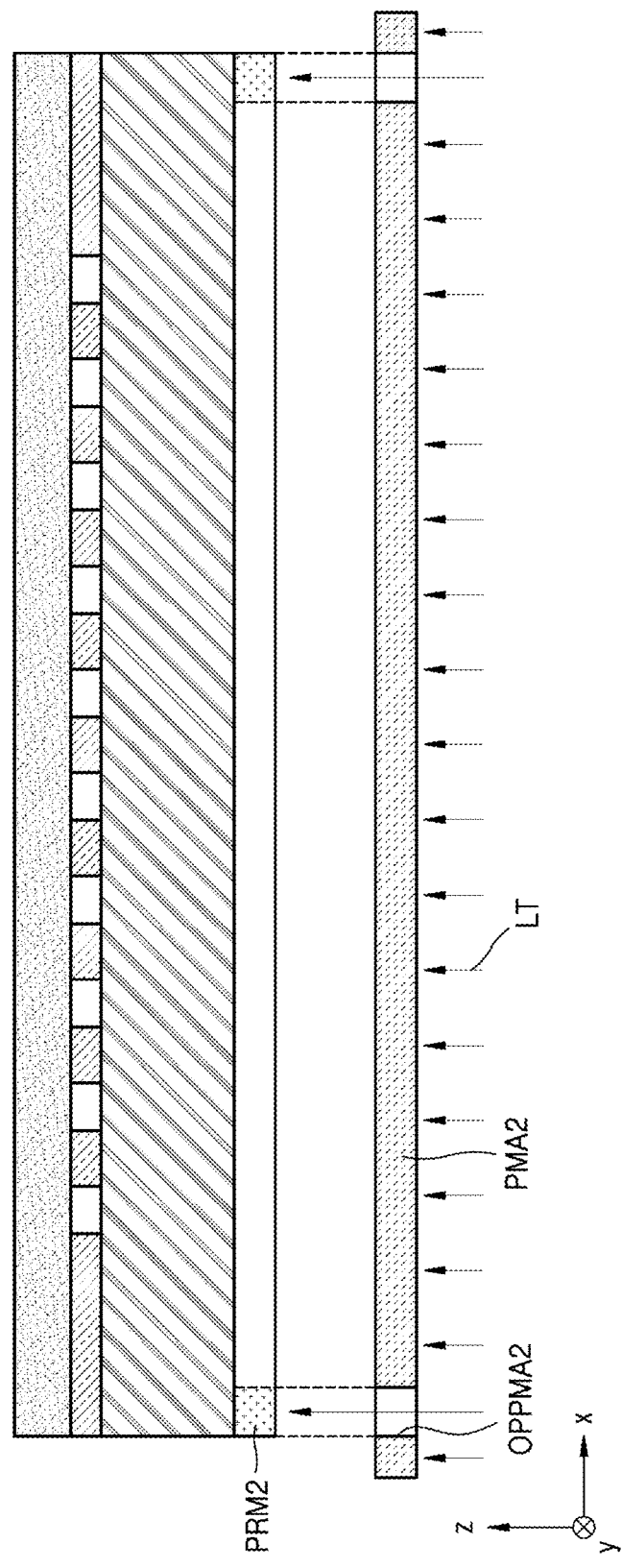
Figure 11:
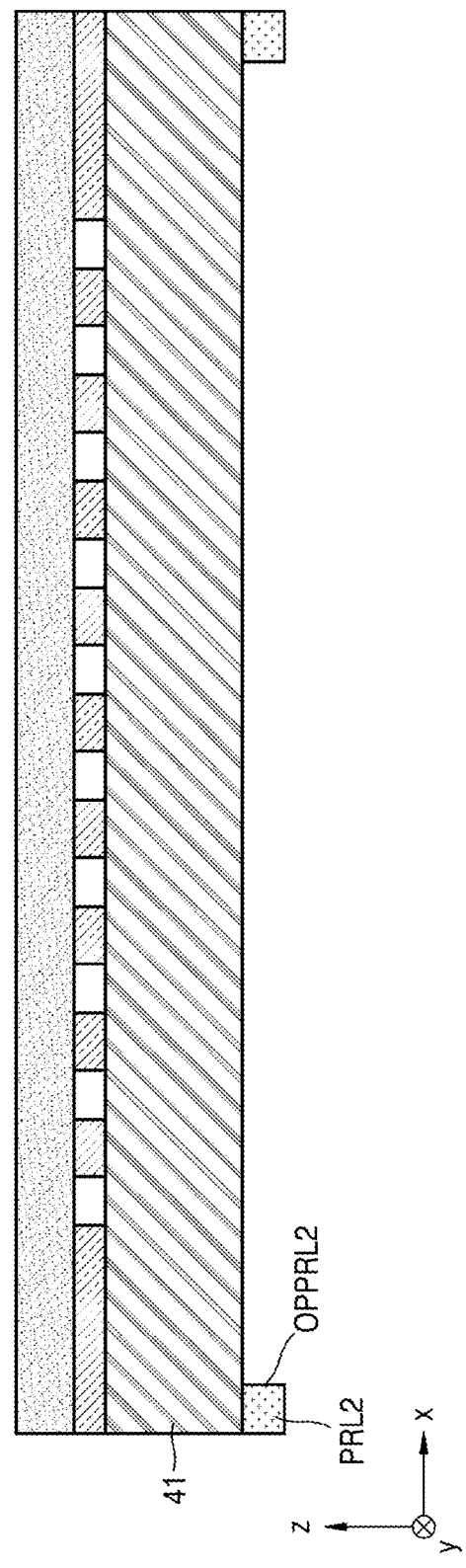

Referring to FIGS. 9 to 11, the forming of the first mask opening OP41 in the first mask layer 41 may include disposing a second photoresist layer PRL2 in which a second photo opening OPPRL2 is arranged (or formed), under the first mask layer 41. The second photoresist layer PRL2 may include the second photo opening OPPRL2.

Referring to FIG. 9, a second photoresist material PRM2 may be disposed under the first mask layer 41. For example, the first mask layer 41 may be disposed on the second photoresist material PRM2, the stopping layer 421 may be disposed on the first mask layer 41, and the inorganic layer 422 may be disposed on the stopping layer 421. The second photoresist material PRM2 may include a photosensitive material.

Referring to FIG. 10, a second photomask PMA2 that has been patterned may be disposed under the second photoresist material PRM2. The second photomask PMA2 may include multiple second photomask openings OPPMA2. The second photomask openings OPPMA2 may be arranged (or formed) in the second photomask PMA2. Light LT may be irradiated from a bottom of the first mask layer 41 toward the second photoresist material PRM2. For example, the light LT may be an ultraviolet ray or the like.

A portion of the light LT may pass through (or penetrate) the second photomask opening OPPMA2 and reach the second photoresist material PRM2, and another portion of the light LT may be blocked by the second photomask PMA2 and not reach the second photoresist material PRM2. A portion of the second photoresist material PRM2, which overlaps the second photomask opening OPPMA2 in a plan view, may be cured.

Referring to FIG. 11, a portion of the second photoresist material (see, e.g., PRM2 of FIG. 10), not overlapping the second photomask opening (see, e.g., OPPMA2 of FIG. 10) in a plan view and not cured, may be removed. After removing of the portion of the second photoresist material (see, e.g., PRM2 of FIG. 10), the second photoresist layer PRL2, in which the second photo opening OPPRL2 is arranged, may be formed. The first mask layer 41 may be exposed from the second photoresist layer PRL2 through the second photo opening OPPRL2.

Figure 12:
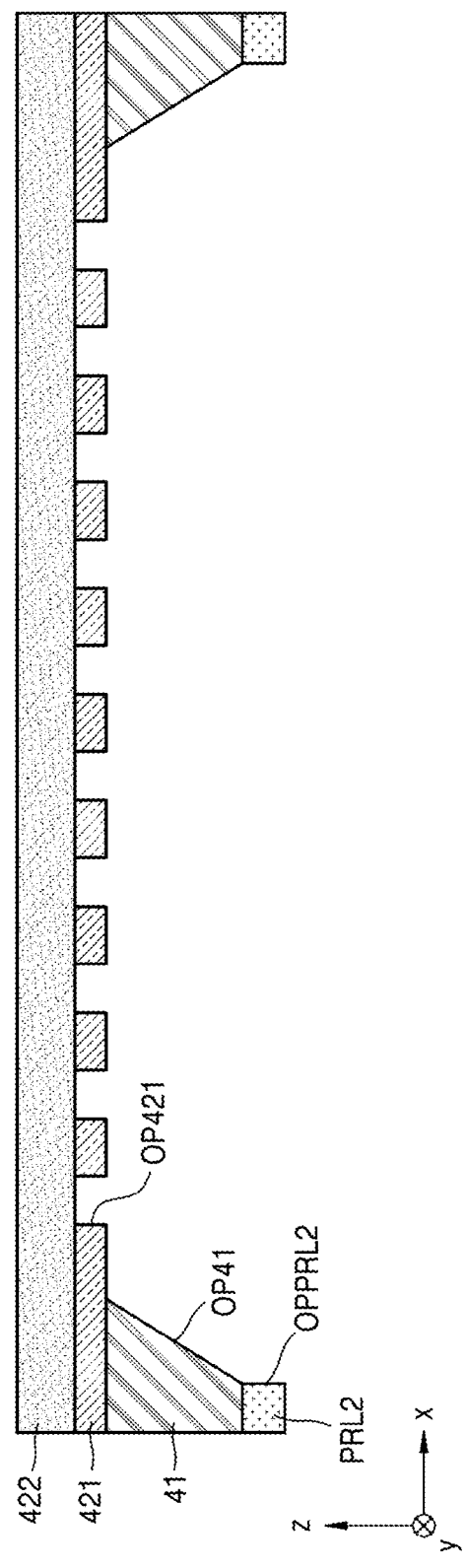

Referring to FIG. 12, the forming of the first mask opening OP41 in the first mask layer 41 may include etching the first mask layer 41 overlapping the second photo opening OPPRL2 arranged in the second photoresist layer PRL2 in a plan view. A portion of the first mask layer 41 may be removed through an etching process. For example, the first mask layer 41 may be etched through a dry etching process.

As the first mask layer 41 is etched, the first mask opening OP41 may be arranged (or formed) in the first mask layer 41. Through the first mask opening OP41, the stopping layer 421 may be exposed from the first mask layer 41. Through the first mask opening OP41 and the stopping layer opening OP421, the inorganic layer 422 may be exposed from the first mask layer 41 and the stopping layer 421.

Figure 13:
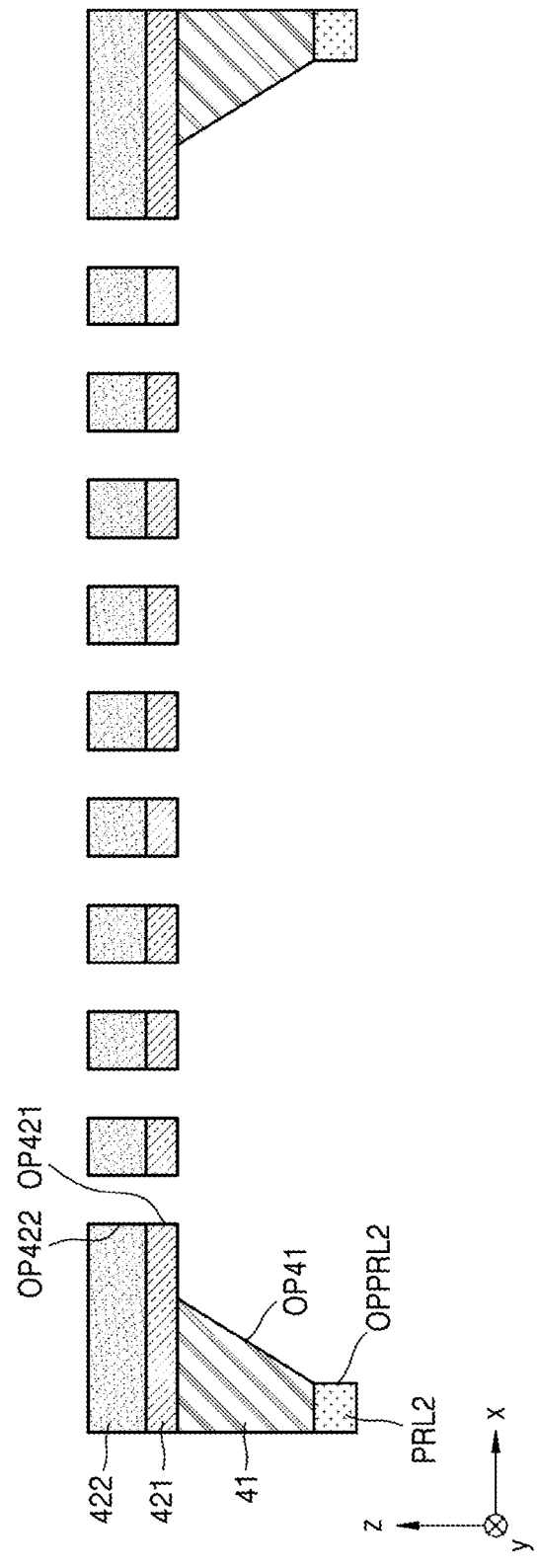

FIG. 13 illustrates the etching of a portion of the inorganic layer 422 overlapping the stopping layer opening OP421 in a plan view. A portion of the inorganic layer 422 may be removed through an etching process. For example, the inorganic layer 422 may be etched through a dry etching process. The etching of the inorganic layer 422 may be performed in a direction in which the stopping layer 421 faces the inorganic layer 422 (e.g., a +z-axis direction).

In a process of the etching of the inorganic layer 422, the stopping layer 421 may be not etched. In the process of the etching of the inorganic layer 422, the stopping layer 421 may function as a mask. For example, etching gas may pass through the stopping layer opening OP421 and contact the inorganic layer 422. In the process of the etching of the inorganic layer 422, the inorganic opening OP422 may be formed in the inorganic layer 422.

Figure 14:
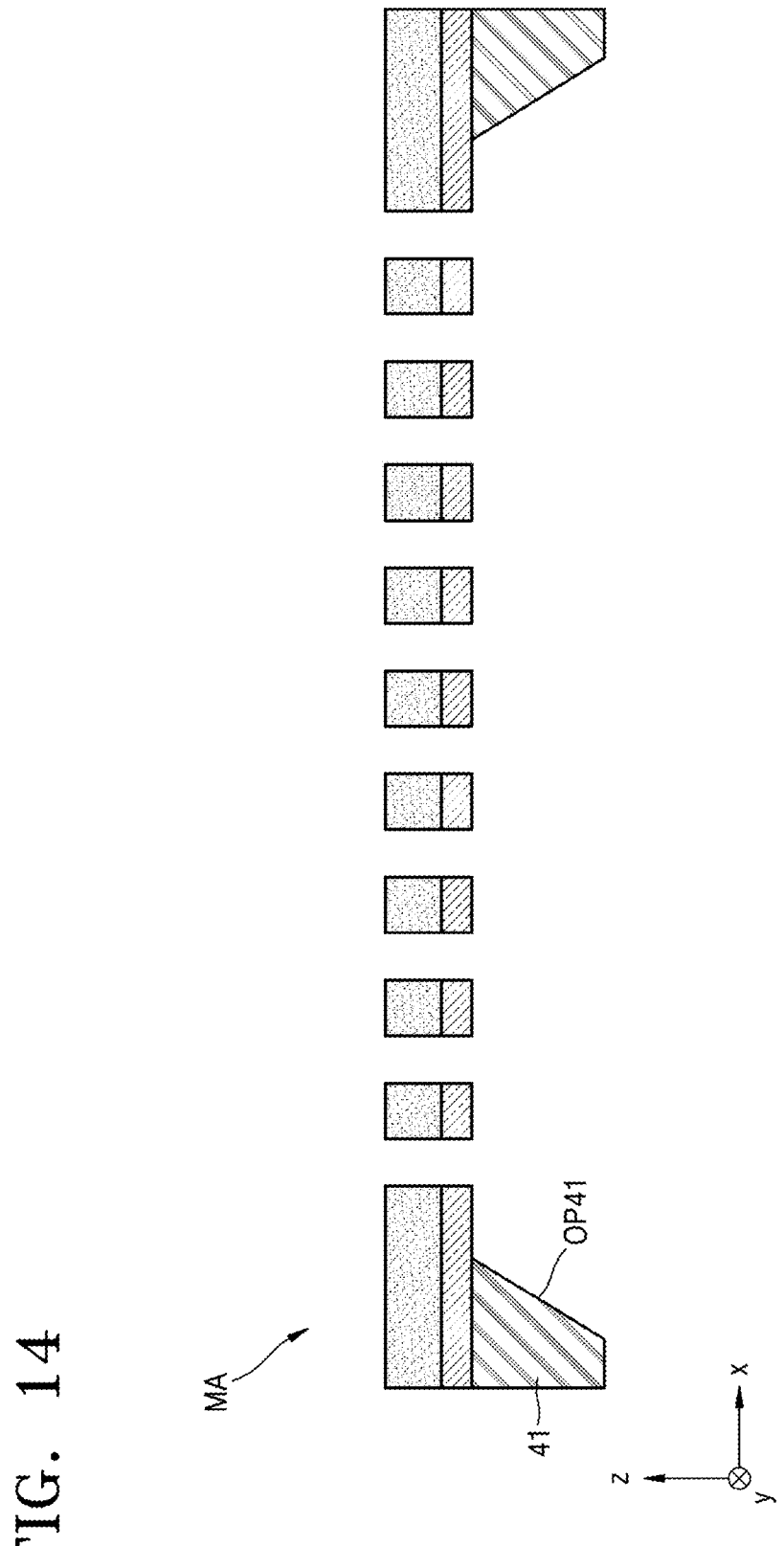

Referring to FIG. 14, the forming of the first mask opening OP41 in the first mask layer 41 may include removing the second photoresist layer (see, e.g., PRL2 of FIG. 13). As the second photoresist layer PRL2 is removed, the mask assembly MA may be manufactured.

Referring again to FIGS. 12 to 14, the etching of the inorganic layer 422 described above in FIG. 13 may be performed between the etching of the first mask layer 41 described above in FIG. 12 and the removing of the second photoresist layer PRL2 described above in FIG. 14. Therefore, in the etching of the inorganic layer 422 shown in FIG. 13, the second photoresist layer PRL2 may still remain without being removed, and the first mask layer 41 may be not etched.

Although FIGS. 4, 5, 9 to 11 illustrates a negative photoresist material having a solubility decreasing as exposed to the light LT, the disclosure is not limited thereto, and a positive photoresist material having a solubility increasing as exposed to light may be used.

Figure 15:
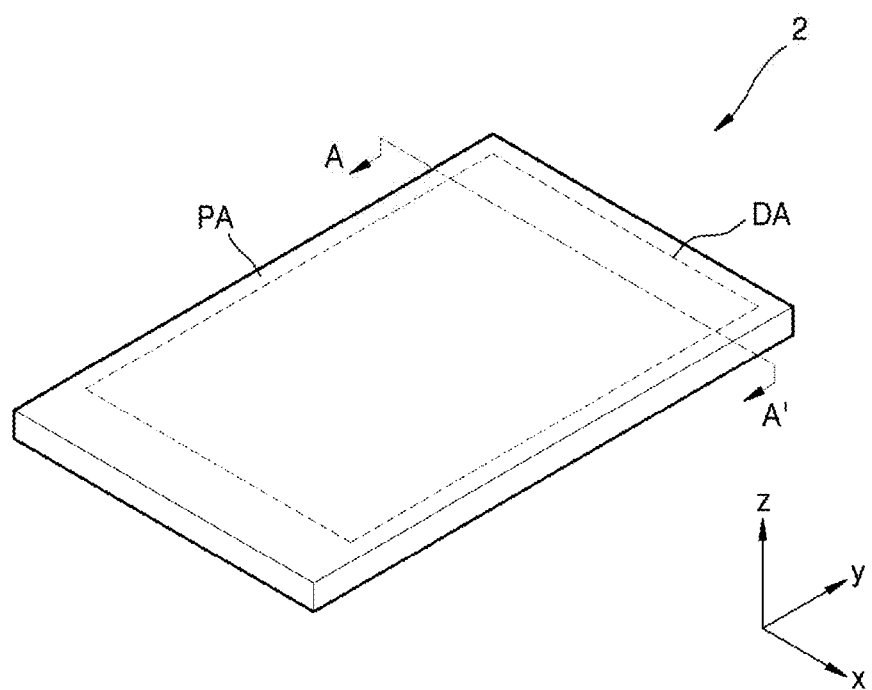
FIG. 15 is a schematic perspective view illustrating a display device according to an embodiment.

FIG. 15 is a schematic perspective view illustrating a display device 2 according to an embodiment.

Referring to FIG. 15, the display device 2 may include a display area DA and a peripheral area PA disposed adjacent to the display area DA. For example, the peripheral area PA may surround the display area DA. The display device 2 may provide images (e.g., certain images) using light emitted from multiple pixels (not shown) arranged in the display area DA.

The peripheral area PA may generally (or entirely) surround the display area DA. The peripheral area PA may be a non-display area in which pixels are not arranged, in which a driver or wirings providing electrical signals or power to the pixels may be arranged.

Referring to FIG. 15, the display device 2 may have a rectangular shape in a plan view in which a horizontal length is greater than a vertical length, but the disclosure is not limited thereto. The display device 2 may have various shapes such as a polygon, a circle, an oval, the like, or a combination thereof.

Hereinafter, according to an embodiment, the display device 2 may be an organic light-emitting display device, but the disclosure is not limited thereto. In another embodiment, the display device 2 may be another type of display device such as a quantum dot light-emitting display or the like.

Figure 16:
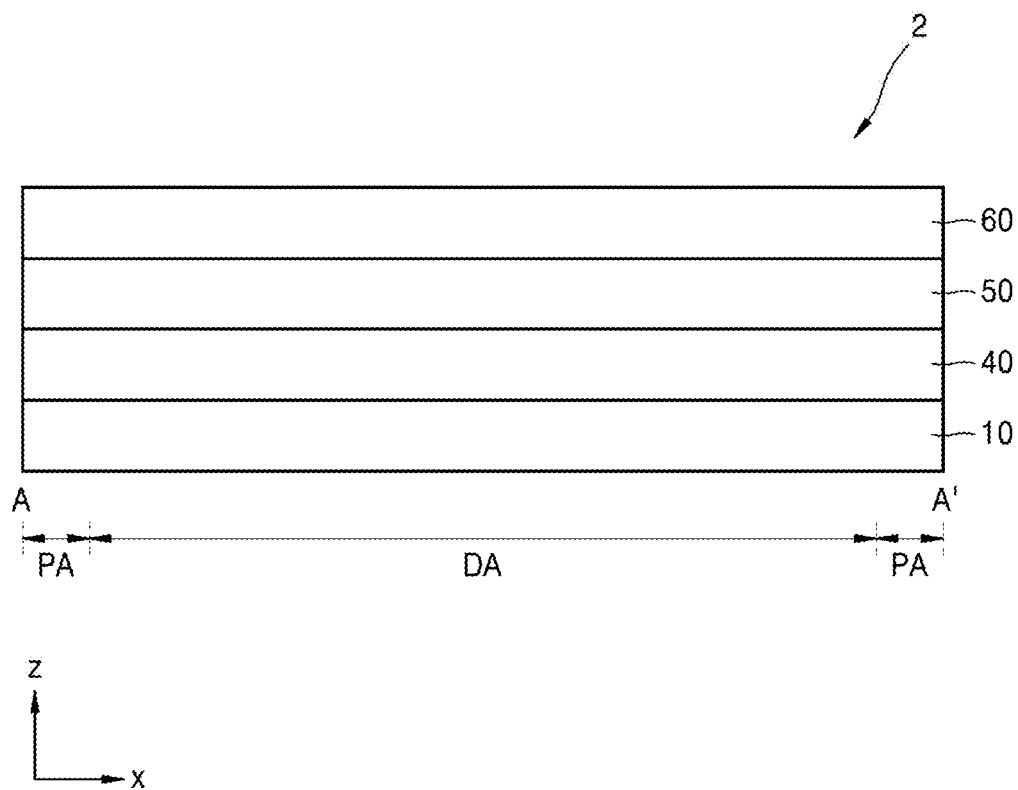
FIG. 16 is a schematic cross-sectional view illustrating a display device according to an embodiment.

FIG. 16 is a schematic cross-sectional view illustrating the display device 2 according to an embodiment. FIG. 16 may correspond to a cross-section taken along line A-A' shown in FIG. 15.

Referring to FIG. 16, the display device 2 may include a display panel 10, an input sensing layer 40 disposed on the display panel 10, an optical function layer 50 disposed on the input sensing layer, and a window 60 covering the display panel 10, the input sensing layer 40, and the optical function layer 50. The display device 2 may be various types of electronic devices such as a mobile phone, a notebook, a smart watch, and the like.

The display panel 10 may display images. The display panel 10 may include pixels arranged in the display area DA. The pixels may include a display element and a pixel circuit connected to the display element. The display element may be an organic light-emitting diode, a quantum-dot organic light-emitting diode, the like, or a combination thereof.

The input sensing layer 40 may obtain coordinate information according to external input such as a touch event or the like. The input sensing layer 40 may include a sensing electrode (or a touch electrode) and trace lines connected to the sensing electrode. The input sensing layer 40 may be disposed on the display panel 10. The input sensing layer 40 may detect foreign inputs in a mutual cap method, a self-cap method, the like, or a combination thereof.

The input sensing layer 40 may be formed on the display panel 10. For example, the input sensing layer 40 may be directly formed on the display panel 10, or may be separately formed and combined to the display panel 10 by an adhesive layer such as an optical clear adhesive or the like. For example, the input sensing layer 40 may be sequentially formed after a process of forming the display panel 10, the input sensing layer 40 may be a portion of the display panel 10, and the adhesive layer may not be formed between the input sensing layer 40 and the display panel 10. Although FIG. 16 illustrates that the input sensing layer 40 is disposed between the display panel 10 and the optical function layer 50, the disclosure is not limited thereto. In another embodiment, the input sensing layer 40 may be disposed on the optical function layer 50, and the input sensing layer 40 may be disposed between the optical function layer 50 and the window 60.

The optical function layer 50 may include an anti-reflection layer (now shown). The anti-reflection layer may decrease a reflectance of light (external light) incident from outside to the display panel 10 through the window 60. In an embodiment, the anti-reflection layer may include a black matrix, color filters (not shown), the like, or a combination thereof. The color filters may be arranged according to colors of light emitted from each of the pixels of the display panel 10.

In another embodiment, the anti-reflection layer may include a retarder (now shown) and a polarizer (now shown). The retarder may be a film type, a liquid crystal coating type, or the like and may include a $\lambda/2$ retarder and/or a $\lambda/4$ retarder. The polarizer may be a film type, a liquid-crystal coating type, or the like. A film type polarizer may include a stretched-type synthetic resin film or the like, and a liquid-crystal coating type polarizer may include liquid crystals or the like in an arrangement (e.g., a certain or selectable arrangement). The retarder and the polarizer may each further include a protection film (not shown) or the like. The retarder and the polarizer or the protection film may be a base layer of the anti-reflection layer.

In another embodiment, the anti-reflection layer may include a destructive interference structure. The destructive interference structure may include a first reflective layer and a second reflective layer disposed on different layers. First reflected light and second reflected light respectively reflected from the first reflective layer and the second reflective layer may undergo constructive interference, and a refractive index of external light may decrease.

In an embodiment, the optical function layer 50 may be sequentially formed after the forming of the display panel 10 and/or the input sensing layer 40. The adhesive layer may not be disposed between the display panel 10 and/or the input sensing layer 40 and the optical function layer 50.

Although not shown in FIG. 16, a layer (e.g., an adhesive layer) including the optical clear adhesive or an optical clear resin may be disposed between the window 60 and the optical function layer 50.

Figure 17:
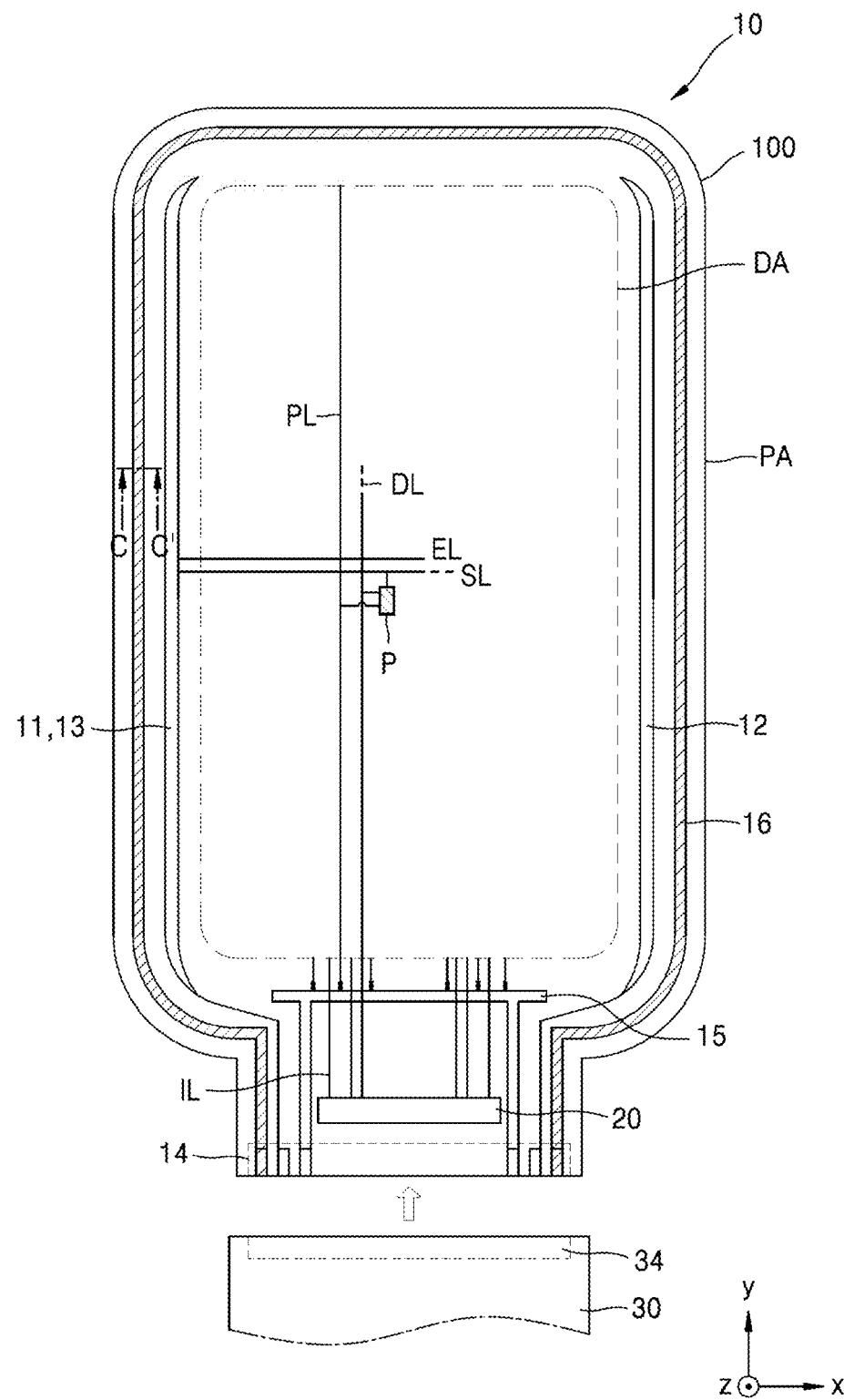
FIG. 17 is a schematic plan view illustrating a display panel according to an embodiment.

FIG. 17 is a schematic plan view illustrating the display panel 10 according to an embodiment. As described above with reference to FIG. 16, the display device (see, e.g., 2 of FIG. 15) according to an embodiment may include the display panel 10. FIG. 17 illustrates an image of the substrate 100 of the display panel 10.

Referring to FIG. 17, the display panel 10 may include the display area DA and the peripheral area PA disposed adjacent to the display area DA. For example, the peripheral area PA may surround the display area DA. The display area DA may be an area for displaying images, and multiple pixels P may be arranged in the display area DA. The display area DA may have various shapes in a plan view such as a circle, an oval, a polygon, a figure, and the like. FIG. 17 illustrates that a shape of the display area DA is approximately rectangle with rounded corners, but the disclosure is not limited thereto.

Each of the pixels P may be a sub-pixel, and may include a display element such as an organic light-emitting diode OLED or the like. The pixel P may emit, for example, red, green, blue, or white light.

The peripheral area PA may be arranged adjacent to (or may surround) the display area DA. Circuits (e.g., peripheral circuits) that drive the pixel P may be arranged in the peripheral area PA. A first scan driving circuit 11, a second scan driving circuit 12, an emission-control driving circuit 13, a terminal 14, a driving power supply wiring 15, and a common power supply wiring 16 may be arranged in the peripheral area PA.

The first scan driving circuit 11 may provide a scan signal to the pixel P through a scan line SL. The second scan driving circuit 12 may be arranged in parallel to the first scan driving circuit 11 with the display area DA disposed between the first scan driving circuit 11 and the second scan driving circuit 12. Some of the pixels P arranged in the display area DA may be electrically connected to the first scan driving circuit 11, and others of the pixels P may be connected to the second scan driving circuit 12. In another embodiment, the second scan driving circuit 12 may be omitted, and all of the pixels P arranged in the display area DA may be electrically connected to the first scan driving circuit 11.

The emission-control driving circuit 13 may be arranged beside (or adjacent to) the first scan driving circuit 11, and may provide an emission control signal to the pixel P through an emission control line EL. Although FIG. 15 illustrates that the emission-control driving circuit 13 is arranged at a side of the display area DA, the disclosure is not limited thereto, and the emission-control driving circuit 13 may be arranged at both sides of the display area DA, similar to the first scan driving circuit 11 and the second scan driving circuit 12.

In an embodiment, the peripheral area PA may include a bending area (not shown) extending from a side (in a −y-axis direction) of the display area DA. The bending area may be bent toward a back surface (or a rear surface) of the display area DA, thereby decreasing an area of a non-display area that may be recognized when viewed from a front surface (or a top surface) of the display device.

A driving chip 20 may be arranged in the peripheral area PA. The driving chip 20 may include an integrated circuit (not shown) that drives the display panel 10. The integrated circuit may include a data driving integrated circuit that generates a data signal, but the disclosure is not limited thereto.

The terminal 14 may be arranged in the peripheral area PA. The terminal 14 may be exposed without being covered by an insulating layer and may be electrically connected to a printed circuit board 30. A terminal 34 of the printed circuit board 30 may be electrically connected to the terminal 14 of the display panel 10.

The printed circuit board 30 may deliver a signal, power, or the like of a controller (not shown) to the display panel 10. A control signal generated in the controller may be delivered to each driving circuit through the printed circuit board 30. The controller may deliver a driving voltage (see, e.g., ELVDD of FIG. 18) to the driving power supply wiring 15 and provide a common voltage (see, e.g., ELVSS of FIG. 18) to the common power supply wiring 16. The driving voltage ELVDD may be delivered to each of the pixels P through a driving voltage line PL connected to the driving power supply wiring 15, and the common voltage ELVSS may be delivered to a counter electrode of the pixel P through the common power supply wiring 16. The driving power supply wiring 15 may have a shape extending in a direction (the x-axis direction) under the display area DA in a plan view. The common power supply wiring 16 may have a loop shape in which a side is open and which partially surrounds the display area DA in a plan view.

The controller may generate the data signal. The data signal that has been generated may be delivered to an input line IL through the driving chip 20 and delivered to the pixel PX through a data line DL connected to the input line IL. In the specification, "line" may include "wiring".

Figure 18:
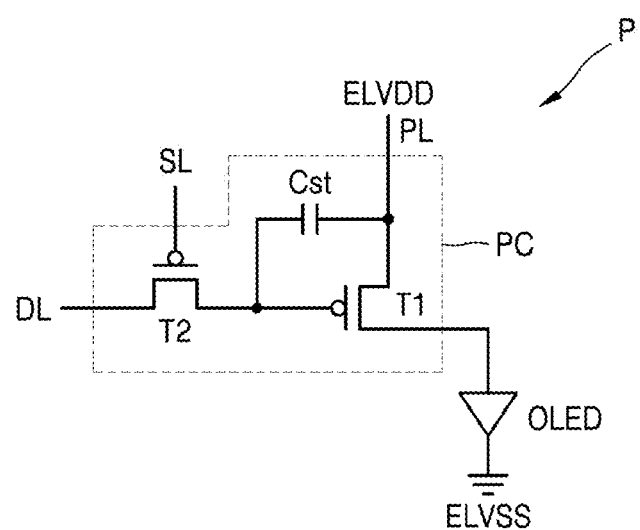
FIG. 18 is a schematic diagram of an equivalent circuit of a pixel included in a display device according to an embodiment.

FIG. 18 is a schematic diagram of an equivalent circuit of the pixel P included in the display device (see, e.g., 2 of FIG. 15) according to an embodiment.

Referring to FIG. 18, the pixel P may include a pixel circuit PC and an organic light-emitting diode OLED as a display element electrically connected to the pixel circuit PC. The pixel circuit PC may include a first thin-film transistor T1, a second thin-film transistor T2, and a storage capacitor Cst. Each of the pixels P may emit red, green, or blue light or emit red, green, blue, or white light through the organic light-emitting diode OLED.

The second thin-film transistor T2, which is a switching thin-film transistor, may be electrically connected to the scan line SL and the data line DL, and may transmit a data voltage input from the data line DL to the first thin-film transistor T1, based on a switching voltage input from the scan line SL. The storage capacitor Cst may be electrically connected to the second thin-film transistor T2 and the driving voltage line PL, and may store a voltage corresponding to a difference between the voltage delivered from the second thin-film transistor T2 and the driving voltage ELVDD provided to the driving voltage line PL.

The first thin-film transistor T1, which is a driving thin-film transistor, may be electrically connected to the driving voltage line PL and the storage capacitor Cst, and may control a driving current flowing from the driving voltage line PL to the organic light-emitting diode OLED, in response to the voltage stored in the storage capacitor Cst. The organic light-emitting diode OLED may emit light of a luminance (e.g., certain or selectable luminance) in response to the driving current. A counter electrode (e.g., a cathode) of the organic light-emitting diode OLED may receive the common voltage ELVSS.

Although FIG. 18 illustrates that the pixel circuit PC includes two thin-film transistors and one storage capacitor, the disclosure is not limited thereto. The number of thin-film transistors and the number of storage capacitors may be variously modified according to designs of pixel circuit PC. For example, the pixel circuit PC may further include three, four, five, or more thin-film transistors.

Figure 19:
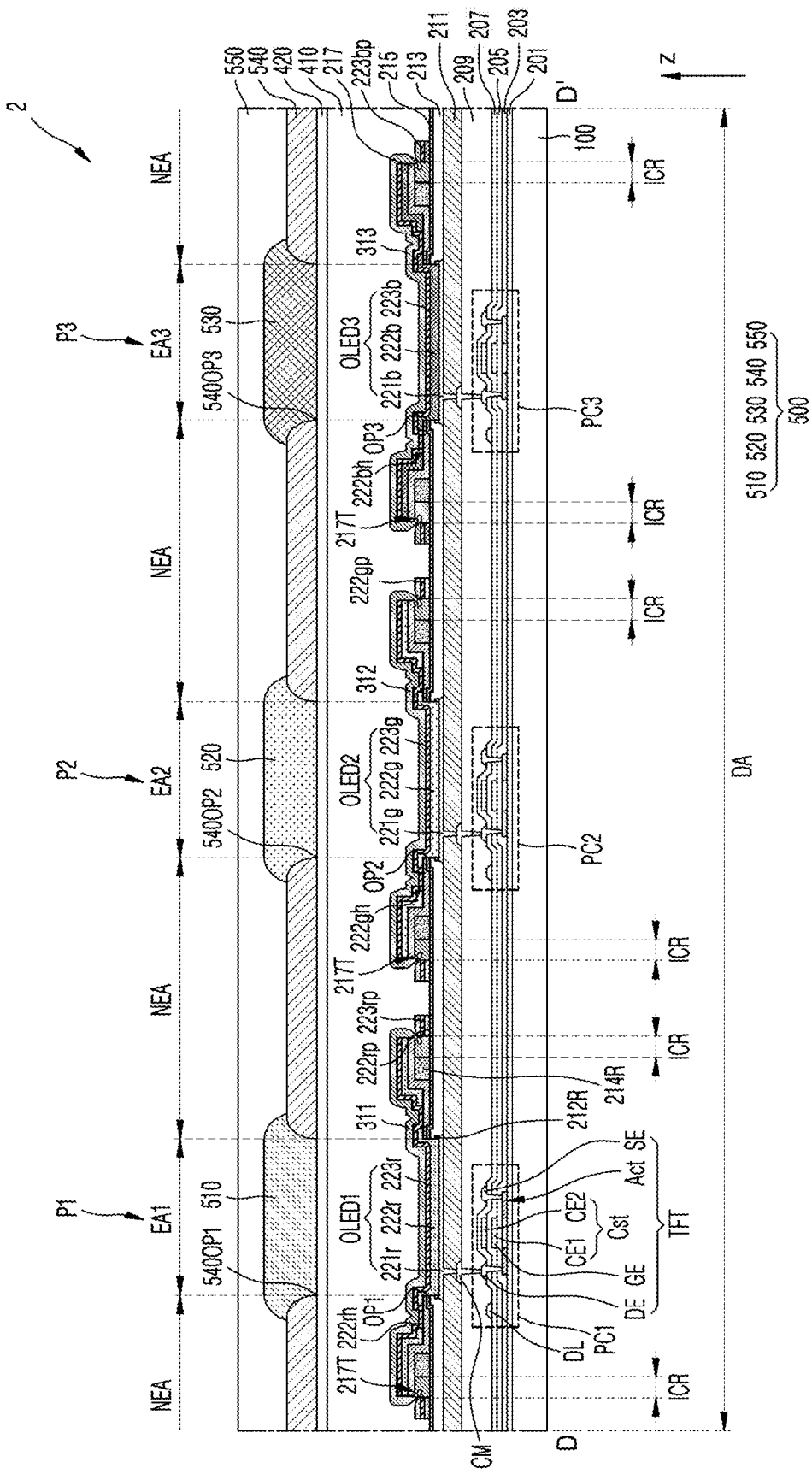
FIG. 19 is a schematic cross-sectional view illustrating a display device according to an embodiment.

FIG. 19 is a schematic cross-sectional view illustrating the display device 2 according to an embodiment.

Referring to FIG. 19, the display device 2 (e.g., the display panel 10 of the display device 2) may include a substrate 100.

The substrate 100 may include glass, a high-molecular resin, the like, or a combination thereof. In an embodiment, the substrate 100 may have a multiple-layer structure in which a base layer including a high-molecular resin and a barrier layer preventing permeation of foreign impurities are alternately stacked each other.

The base layer may include a high-molecular resin including polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), the like, or a combination thereof.

The barrier layer may include an inorganic material such as silicon nitride ($SiN_x$), silicon oxide ($SiO_x$), the like, or a combination thereof.

A first pixel P1 that emits light of a first color, a second pixel P2 that emits light of a second color, and a third pixel P3 that emits light of a third color may be arranged in the display area DA on the substrate 100. The first color, the second color, and the third color may each be one of red, blue, green, or white.

The first pixel P1 may include a first pixel circuit PC1 and a first organic light-emitting diode OLED1 as a display element electrically connected to the first pixel circuit PC1. The second pixel P2 may include a second pixel circuit PC2 and a second organic light-emitting diode OLED2 electrically connected to the second pixel circuit PC2. The third pixel P3 may include a third pixel circuit PC3 and a third organic light-emitting diode OLED3 electrically connected to the third pixel circuit PC3.

A buffer layer 201 may be disposed on the substrate 100 and prevent permeation of impurities into a semiconductor layer Act of a thin-film transistor TFT of the first pixel circuit PC1, the second pixel circuit PC2, and the third pixel circuit PC3. The buffer layer 201 may include an inorganic insulating material such as $SiN_x$, silicon oxynitride (SiON), $SiO_x$, the like, or a combination thereof, and may have a single layer or multiple layers.

The first pixel circuit PC1, the second pixel circuit PC2, and the third pixel circuit PC3 may be disposed on the buffer layer 201. The first pixel circuit PC1 may include the thin-film transistor TFT and the storage capacitor Cst. The thin-film transistor TFT may include the semiconductor layer Act, a gate electrode GE, a source electrode SE, and a drain electrode DE. The thin-film transistor TFT shown in FIG. 19 may correspond to the first thin-film transistor T1 described with reference to FIG. 18. The data line DL may be electrically connected to the second thin-film transistor T2 that is not shown in FIG. 19 but included in the first pixel circuit PC1. Although a top-gate type in which the gate electrode GE is disposed above the semiconductor layer Act with a gate insulating layer 203 interposed between the semiconductor layer Act and the gate electrode Ge is shown in FIG. 19, the disclosure is not limited thereto, and according to another embodiment, the thin-film transistor TFT may be a bottom-gate type. The second pixel circuit PC2 and the third pixel circuit PC3 may have a structure substantially identical or similar to a structure of the first pixel circuit PC1. Hereinafter, components of the first pixel circuit PC1 will be described.

The semiconductor layer Act may include polysilicon or the like. In another embodiment, the semiconductor layer Act may include amorphous silicon, an oxide semiconductor, an organic semiconductor, the like, or a combination thereof. The gate electrode GE may include a low-resistance metal. The gate electrode GE may include a conductive material such as molybdenum (Mo), aluminum (Al), copper (Cu), titanium (Ti), the like, or a combination thereof, and may have a single layer or multiple layers.

The gate insulating layer 203 between the semiconductor layer Act and the gate electrode GE may include an inorganic insulating material such as $SiO_x$, $SiN_x$, SiON, aluminum oxide ($Al_2O_3$), titanium oxide ($TiO_x$), tantalum oxide ($Ta_2O_5$), hafnium oxide ($HfO_2$), the like, or a combination thereof. The gate insulating layer 203 may have a single layer or multiple layers.

The storage capacitor Cst may include a lower electrode CE1 and an upper electrode CE2 overlapping each other in a plan view with the first interlayer insulating layer 205 interposed between the lower electrode CE1 and the upper electrode CE2. The storage capacitor Cst may overlap the thin-film transistor TFT in a plan view. FIG. 19 illustrates that the gate electrode GE of the thin-film transistor TFT is the lower electrode CE1 of the storage capacitor Cst. In another embodiment, the storage capacitor Cst may not overlap the thin-film transistor TFT in a plan view. The storage capacitor Cst may be covered by a second interlayer insulating layer 207. The upper electrode CE2 of the storage capacitor Cst may include a conductive material such as Mo, Al, Cu, Ti, the like, or a combination thereof, and may have a single layer or multiple layers.

The first interlayer insulating layer 205 and the second interlayer insulating layer 207 may include an inorganic insulating material such as $SiO_x$, $SiN_x$, SiON, $Al_2O_3$, $TiO_x$, $Ta_2O_5$, $HfO_2$, the like, or a combination thereof. The first interlayer insulating layer 205 and the second interlayer insulating layer 207 may each have a single layer or multiple layers.

The source electrode SE and the drain electrode DE and the data line DL may be disposed on a same layer, and may include a same material. For example, the source electrode SE, the drain electrode DE, and the data line DL may be disposed on the second interlayer insulating layer 207. The source electrode SE, the drain electrode DE, and the data line DL may include a highly conductive material. The source electrode SE and the drain electrode DE may each include a conductive material such as Mo, Al, Cu, Ti, the like, or a combination thereof, and may have a single layer or multiple layers. In an embodiment, the source electrode SE, the drain electrode DE, and the data line DL may each include multiple layers of Ti/Al/Ti.

The first pixel circuit PC1, the second pixel circuit PC2, and the third pixel circuit PC3 each including the thin-film transistor TFT and the storage capacitor Cst may be covered by a first organic insulating layer 209. The first organic insulating layer 209 may include a top surface that is generally flat.

The first organic light-emitting diode OLED1 electrically connected to the first pixel circuit PC1, the second organic light-emitting diode OLED2 electrically connected to the second pixel circuit PC2, and the third organic light-emitting diode OLED3 electrically connected to the third pixel circuit PC3 may be disposed on the first organic insulating layer 209.

The first pixel circuit PC1 may be electrically connected to a first pixel electrode 221r of the first organic light-emitting diode OLED1. For example, referring to FIG. 19, a contact metal layer CM may be disposed between the thin-film transistor TFT and the first pixel electrode 221r. The contact metal layer CM may contact the thin-film transistor TFT through a contact hole penetrating the first organic insulating layer 209, and the first pixel electrode 221r may contact the contact metal layer CM through a contact hole penetrating a second organic insulating layer 211. The contact metal layer CM may include a conductive material such as Mo, Al, Cu, Ti, the like, or a combination thereof, and may have a single layer or multiple layers. In an embodiment, the contact metal layer CM may have multiple layers of Ti/Al/Ti.

The first organic insulating layer 209 and the second organic insulating layer 211 may each include an organic insulating material such as a general-purpose polymer such as polymethylmethacrylate (PMMA), polystyrene (PS), the like, or a combination thereof, a polymer derivative having a phenol-based group, an acryl-based polymer, an imide-based polymer, an arylether-based polymer, an amide-based polymer, a fluoride-based polymer, a p-xylene-based polymer, a vinylalcohol-based polymer, the like, or a blend thereof. In an embodiment, the first organic insulating layer 209 and the second organic insulating layer 211 may each include polyimide or the like.

According to another embodiment, one of the first organic insulating layer 209 and the second organic insulating layer 211 may be omitted, and the contact metal layer CM may be omitted.

The first organic light-emitting diode OLED1 may include the first pixel electrode 221r, a first emission layer 222r, and a first counter electrode 223r. The second organic light-emitting diode OLED2 may include a second pixel electrode 221g, a second emission layer 222g, and a second counter electrode 223g. The third organic light-emitting diode OLED3 may include a third pixel electrode 221b, a third emission layer 222b, and a third counter electrode 223b. The second organic light-emitting diode OLED2 and the third organic light-emitting diode OLED3 may have a structure substantially identical or similar to a structure of the first organic light-emitting diode OLED1.

The first pixel electrode 221r may be disposed on the second organic insulating layer 211. The first pixel electrode 221r may include a conductive material such as indium tin oxide (ITO), indium zinc oxide (IZO), zinc oxide (ZnO), indium oxide ($In_2O_3$), indium gallium oxide (IGO), aluminum zinc oxide (AZO), the like, or a combination thereof. According to another embodiment, the first pixel electrode 221r may include a reflective film such as silver (Ag), magnesium (Mg), aluminum (Al), platinum (Pt), palladium (Pd), gold (Au), nickel (Ni), neodymium (Nd), iridium (Ir), chromium (Cr), the like, or an alloy thereof. In another embodiment, the first pixel electrode 221r may further include a film such as ITO, IZO, ZnO, $In_2O_3$, the like, or a combination thereof on or under the reflective film.

A pixel defining layer 213 and a bank layer 215 may be disposed on the first pixel electrode 221r. In a plan view, the pixel defining layer 213 may overlap a rim of the first pixel electrode 221r. The pixel defining layer 213 may include an inorganic insulating material such as $SiN_x$, SiON, $SiO_x$, the like, or a combination thereof.

A first residual sacrificial layer 212R may be disposed between the first pixel electrode 221r and the pixel defining layer 213. The first residual sacrificial layer 212R may include a portion remaining after removing a sacrificial layer (not shown) protecting a top surface of the first pixel electrode 221r. The first residual sacrificial layer 212R may be disposed in an area in which the pixel defining layer 213 and the first pixel electrode 221r overlap each other in a plan view. For example, the first residual sacrificial layer 212R may be arranged along the rim of the first pixel electrode 221r and expose a portion (e.g., a center portion) of the first pixel electrode 221r.

The first residual sacrificial layer 212R may be consecutively formed after forming of the first pixel electrode 221r, and may include a material which may be selectively etched without damage to the first pixel electrode 221r. For example, the first residual sacrificial layer 212R may include IGZO, IZO, and/or the like.

The first residual sacrificial layer 212R and the pixel defining layer 213 may overlap the rim of the first pixel electrode 221r in a plan view and increase distances of the first pixel electrode 221r from the bank layer 215 and the first counter electrode 223r, thereby increasing occurrence of arcs and the like among the first pixel electrode 221r, the bank layer 215, and the first counter electrode 223r. In embodiments, the sacrificial layer may be completely removed, and the first residual sacrificial layer 212R may not be formed. A groove obtained by removing the sacrificial layer between the first pixel electrode 221r and the pixel defining layer 213 may be empty, or the first emission layer 222r described below may be formed in the groove.

The bank layer 215 may be disposed on the pixel defining layer 213. The bank layer 215 may include a conductive material. For example, the bank layer 215 may include a conductive material such as Mo, Al, Cu, Ti, the like, or a combination thereof, and may have a single layer or multiple layers. For example, the bank layer 215 may have a double-layer structure including Al/Ti, a triple-layer structure including Ti/Al/Ti, or the like.

The pixel defining layer 213 and the bank layer 215 may extend from the display area DA of the substrate 100 to the peripheral area (see, e.g., PA of FIG. 17), and the bank layer 215 may contact (e.g., directly contact) the common power supply wiring (see, e.g., 16 of FIG. 17) in the peripheral area (see, e.g., PA of FIG. 17) through an opening of the pixel defining layer 213. Accordingly, the bank layer 215 may function as a connection electrode or an auxiliary wiring providing the common voltage ELVSS to the first counter electrode 223r, the second counter electrode 223g, and the third counter electrode 223b described below.

A first conductive layer 217 may be disposed on the bank layer 215. The first conductive layer 217 may have a tip 217T protruding in a direction from a center of the first pixel electrode 221r. In a plan view, the tip 217T of the first conductive layer 217 may have a shape of loop surrounding (e.g., completely surrounding) the first pixel electrode 221r.

A first opening OP1 may penetrate the pixel defining layer 213, the bank layer 215, and the first conductive layer 217 and expose a center of the top surface of the first pixel electrode 221r, and the first emission layer 222r described below may overlap and contact the first pixel electrode 221r through the first opening OP1 in a plan view. Accordingly, the first opening OP1 may define a first emission area EA1. An outside of the first emission area EA1 may be a non-emission area NEA. Likewise, a second opening OP2 may define a second emission area EA2, and a third opening OP3 may define a third emission area EA3.

A portion of the first conductive layer 217 may be spaced apart from the bank layer 215 in a direction (the z-axis direction) perpendicular to the substrate 100 and form the tip 217T protruding in a direction from the center of the first pixel electrode 221r. The tip 217T of the first conductive layer 217 may be formed as a portion of the sacrificial layer between the first conductive layer 217 and the bank layer 215 is removed, and the first conductive layer 217 may have an undercut structure. Accordingly, the tip 217T of the first conductive layer 217 may have an eaves structure in which a bottom surface of the tip 217T is exposed. A protrusion length d1 of the tip 217T of the first conductive layer 217 may be equal to or greater than about 0.5 um. In embodiments, the protrusion length d1 of the tip 217T of the first conductive layer 217 may be in a range of about 0.3 um to about 1 um. For example, the protrusion length d1 of the tip 217T of the first conductive layer 217 may be in a range of about 0.3 um to about 0.7 um.

The first conductive layer 217 may include a conductive material. For example, the first conductive layer 217 may include a conductive material such as Mo, Al, Cu, Ti, the like, or a combination thereof, and may have a single layer or multiple layers. For example, the first conductive layer 217 may have a double-layer structure of Al/Ti, a triple-layer structure of Ti/Al/Ti, or the like.

In an embodiment, a low reflectance layer (not shown) may be disposed on the first conductive layer 217. The low reflectance layer may include a layer having a superficial reflectance lower than a superficial reflectance of the first conductive layer 217. The low reflectance layer may prevent light (external light) incident to the display device 2 from being reflected at a surface of the first conductive layer 217 and recognized by users of the display device 2.

In an embodiment, the low reflectance layer may include a low reflectance material. The low reflectance material may include a metal oxide having a high absorption ratio, for example, a high extinction coefficient (k). For example, the low reflectance layer may include at least one of copper oxide (CuO), calcium oxide (CaO), molybdenum oxide ($MoO_x$), and zinc oxide (ZnO). In embodiments, the low reflectance layer may include CuO, CaO, the like, or a combination thereof.

The second residual sacrificial layer 214R may be disposed between the bank layer 215 and the first conductive layer 217. The second residual sacrificial layer 214R may be a remaining portion of the sacrificial layer removed to form the tip 217T of the first conductive layer 217. In a plan view, the second residual sacrificial layer 214R may be spaced apart from the first pixel electrode 221r by a distance (e.g., a certain or selectable distance), and may have a shape of loop surrounding (e.g., completely surrounding) the first pixel electrode 221r. Because of the second residual sacrificial layer 214R, the first conductive layer 217 may have an undercut structure.

The second residual sacrificial layer 214R may determine the protrusion length d1 of the tip 217T of the first conductive layer 217. For example, the second residual sacrificial layer 214R may be disposed inside an end of the tip 217T of the first conductive layer 217, and the protrusion length d1 of the tip 217T may be a length from a sidewall of the second residual sacrificial layer 214R to the end of the tip 217T.

The second residual sacrificial layer 214R may include a material which may be selectively etched without damage to the first pixel electrode 221r, the bank layer 215, and the first conductive layer 217. For example, the second residual sacrificial layer 214R and the first residual sacrificial layer 212R may include a same material. The second residual sacrificial layer 214R may include IGZO, IZO, the like, or a combination thereof.

The first emission layer 222r may be arranged on the first pixel electrode 221r and the first conductive layer 217. For example, the first emission layer 222r may contact the first pixel electrode 221r through the first opening OP1. The first pixel electrode 221r may include a high-molecular or low-molecular organic material emitting light of first color (e.g., red). According to another embodiment, the first emission layer 222r may include an inorganic material, quantum dots, the like, or a combination thereof.

The first emission layer 222r may include a first function layer (not shown) and a second function layer (not shown) on the first emission layer 222r and/or under the first emission layer 222r. The first function layer may be a hole transport layer (HTL) and/or a hole injection layer (HIL). The second function layer may be an electron transport layer (ETL) and/or an electron injection layer (EIL).

Although FIG. 19 illustrates a single stack structure including a single emission layer, in embodiments, the display device 2 may have a tandem structure such as a multi-stack structure including multiple emission layers. In case that the display device 2 has a tandem structure, a charge generation layer (CGL) may be disposed between the emission layers.

The first emission layer 222r may be isolated from a dummy portion 222rp by the tip 217T of the first conductive layer 217. The first emission layer 222r may include sub layers (e.g., the first function layer, the second function layer, the like, or a combination thereof). The sub layers and the dummy portion 222rp may have a same material and/or same number.

The first emission layer 222r may have at least one first hole 222rh exposing a portion of a top surface of the first conductive layer 217. The second emission layer 222g may have at least one second hole 222gh exposing a portion of a top surface of the first conductive layer 217. The third emission layer 222b may have at least one third hole 222bh exposing a portion of a top surface of the first conductive layer 217.

The second emission layer 222g may include a high-molecular or low-molecular organic material emitting light of second color (e.g., green), and the third emission layer 222b may include a high-molecular or low-molecular organic material emitting light of third color (e.g., blue).

The first counter electrode 223r may be isolated from a dummy portion 223rp by the tips 217T of the first conductive layer 217. The first counter electrode 223r and the dummy portion 223rp may include a same material. The second counter electrode 223g may be isolated from a dummy portion 223gp by the tips 217T of the first conductive layer 217. The third counter electrode 223b and the dummy portion 223bp may include a same material.

The first counter electrode 223r may be a (semi) transparent layer including Ag, Mg, Al, Pt, Pd, Au, Ni, Nd, Ir, Cr, Li, Ca, the like, or alloys thereof. The first counter electrode 223r may further include a layer of ITO, IZO, ZnO, $In_2O_3$, the like, or a combination thereof on the (semi) transparent layer.

A first inorganic encapsulation layer 311 may be disposed on the first counter electrode 223r. As the first inorganic encapsulation layer 311 has a step coverage, the first inorganic encapsulation layer 311 may cover at least a portion of the exposed bottom surface of the tip 217T of the first conductive layer. For example, the first inorganic encapsulation layer 311 may be consecutively formed and cover a top surface and side surfaces of the first counter electrode 223r, a side surface of the first emission layer 222r, side surfaces and the bottom surface of the tip 217T of the first conductive layer 217, side surfaces of the second residual sacrificial layer 214R, and a top surface of the bank layer 215.

The first inorganic encapsulation layer 311 may include an inorganic insulating material such as $SiN_x$, SiON, $SiO_x$, or the like. The first inorganic encapsulation layer 311 may contact (e.g., directly contact) a metal surface on the side surfaces and bottom surface of the tip 217T of the first conductive layer 217 and form an inorganic contact area ICR. Accordingly, the inorganic contact area ICR may form a closed loop surrounding (e.g., completely surrounding) the first organic light-emitting diode OLED1, thereby reducing or preventing paths through which impurities such as moisture and/or air permeate.

Referring to FIG. 19, the second inorganic encapsulation layer 312 may encapsulate the second organic light-emitting diode OLED2, and the third inorganic encapsulation layer 313 may encapsulate the third organic light-emitting diode OLED3. As the first inorganic encapsulation layer 311, the second inorganic encapsulation layer 312, and the third inorganic encapsulation layer 313 form the inorganic contact area ICR in the display area DA, an inorganic contact area of the peripheral area (see, e.g., PA of FIG. 17) separation defects caused by the emission layer may be decreased. As the first to third organic light-emitting diodes OLED1 to OLED3 are encapsulated in pixel unit, despite formation of a path through which impurities such as moisture and/or air permeate, propagation of defects caused by the path to the neighboring pixels may be prevented.

An organic planarization layer 410 may cover the first inorganic encapsulation layer 311, the second inorganic encapsulation layer 312, and the third inorganic encapsulation layer 313. The organic planarization layer 410 may cover bumps caused by the pixel defining layer 213, the bank layer 215, and the first conductive layer 217 to provide a flat base surface for components disposed on the organic planarization layer 410. The organic planarization layer 410 may include a polymer-based material. For example, the organic planarization layer 410 may include an acryl-based resin, an epoxy-based resin, polyimide, polyethylene, the like, or a combination thereof.

In an embodiment, a refractive index of the organic planarization layer 410 may be greater than a refractive index of the first inorganic encapsulation layer 311, the second inorganic encapsulation layer 312, and the third inorganic encapsulation layer 313. For example, the refractive index of the organic planarization layer 410 may be equal to or greater than about 1.6. The refractive index of the organic planarization layer 410 may be in a range of about 1.6 to about 1.9. The organic planarization layer 410 may further include scattering particles for a higher refractive index. For example, metal oxide particles such as $ZnO_x$, $TiO_2$, $ZrO_2$, $BaTiO_3$, the like, or a combination thereof may be scattered in the organic planarization layer 410.

A protective layer 420 may be disposed on the organic planarization layer 410. The protective layer 420 may include an inorganic insulating material such as $SiN_x$, SiON, $SiO_x$, the like, or a combination thereof. In an embodiment, a refractive index of the protective layer 420 may be less than a refractive index of the organic planarization layer 410.

An anti-reflection layer 500 including a first color filter 510, a second color filter 520, a third color filter 530, a light-shielding layer 540, and an overcoat layer 550 may be disposed on the protective layer 420. The anti-reflective layer 500 may decrease a reflectance of the light (external light) incident from the outside to the display device 2.

The light-shielding layer 540 may overlap the bank layer 215 and the first conductive layer 217 in a plan view and may at least partially absorb the light reflected by the bank layer 215 and the first conductive layer 217 in the non-emission area NEA. The non-emission area NEA may be an area, not overlapping the first emission area EA1, the second emission area EA2, and the third emission area EA3 in a plan view. The light-shielding layer 540 may include a black pigment or the like. The light-shielding layer 540 may include a black matrix. The first emission area EA1 may include a first filter opening 540OP1 corresponding to the first emission area EA1, a second filter opening 540OP2 corresponding to the second emission area EA2, and a third filter opening 540OP3 corresponding to the third emission area EA3.

The first color filter 510 may be disposed in the first filter opening 540OP1 corresponding to the first emission layer 222r under the first color filter 510. The first emission layer 222r may selectively transmit the light emitted from the first emission layer 222r. For example, the first color filter 510 may be a red color filter that transmits red light.

Likewise, the second color filter 520 may correspond to the second emission layer 222g and be in the second filter opening 540OP2. The second color filter 520 may selectively transmit the light emitted from the second emission layer 222g. The third color filter 530 may correspond to the third emission layer 222b and be in the third filter opening 540OP3. The third color filter 530 may selectively transmit the light emitted from the third emission layer 222b. For example, the second color filter 520 may be a green color filter that transmits green light, and the third color filter 530 may be a blue color filter that transmits blue light.

The overcoat layer 550 may be disposed on the first color filter 510, the second color filter 520, and the third color filter 530. The overcoat layer 550, which is a light-transmitting layer, may cover bumps caused by the first color filter 510, the second color filter 520, the third color filter 530, and the light-shielding layer 540 and provide a flat top surface. The overcoat layer 550 may include a non-colored light-transmitting organic material such as an acryl-based resin or the like.

Figure 20:
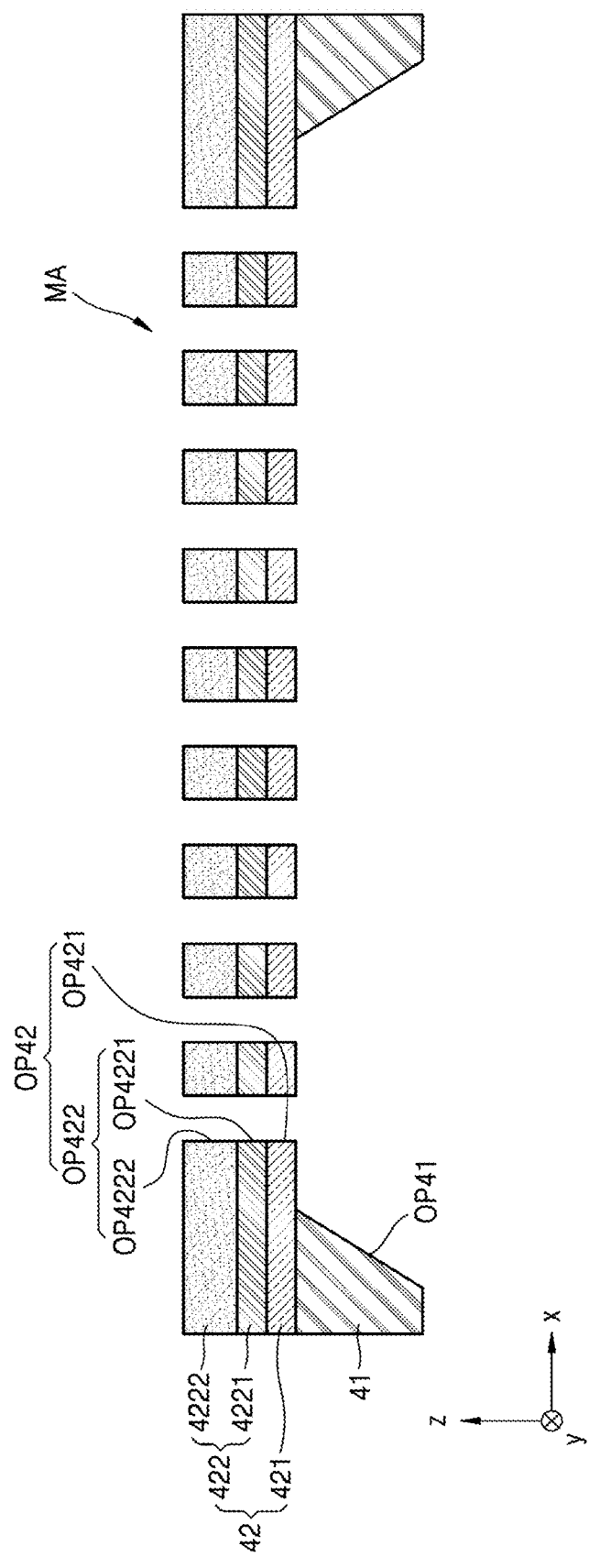
FIG. 20 is a schematic cross-sectional view illustrating a mask assembly according to another embodiment.

FIG. 20 is a schematic cross-sectional view illustrating the mask assembly MA according to another embodiment.

In FIG. 20, same reference numerals as those of FIG. 2 indicate same members, and some of descriptions thereof will not be repeatedly given.

Referring to FIG. 20, the mask assembly MA may include the first mask layer 41 and the second mask layer 42.

The first mask layer 41 may support the second mask layer 42. The first mask layer 41 may include a first mask opening OP41. The first mask opening OP41 may be arranged (or formed) in the first mask layer 41 to pass the deposition material (see, e.g., M of FIG. 1).

The second mask layer 42 may be disposed on the first mask layer 41. The second mask layer 42 may include a second mask opening OP42. The second mask opening OP42 may be arranged (or formed) in the second mask layer 42 to pass the deposition material (see, e.g., M of FIG. 1). The second mask opening OP42 may be provided in multiple and may overlap the first mask opening OP41 in a plan view.

The inorganic layer 422 may be disposed on the stopping layer 421, which is disposed on the first mask layer 41. The inorganic layer 422 may include a first inorganic layer 4221 and a second inorganic layer 4222. The first inorganic layer 4221 may be disposed on the stopping layer 421, and the second inorganic layer 4222 may be disposed on the first inorganic layer 4221. An etching selectivity ratio of the second inorganic layer 4222 may be greater than an etching selectivity ratio of the first inorganic layer 4221. The etching selectivity ratio of the first inorganic layer 4221 may be less than the etching selectivity of the second inorganic layer 4222.

The second mask opening OP42 may include a stopping layer opening OP421 and an inorganic opening OP422. The stopping layer opening OP421 may be arranged (or formed) in the stopping layer 421, and the inorganic opening OP422 may be arranged (or formed) in the inorganic layer 422. The stopping layer opening OP421 and the inorganic opening OP422 may overlap each other in a plan view.

The inorganic opening OP422 may include a first inorganic opening OP4221 and a second inorganic opening OP4222. The first inorganic opening OP4221 may be disposed in the first inorganic layer 4221, and the second inorganic opening OP4222 may be disposed in the second inorganic layer 4222. The first inorganic opening OP4221 and the second inorganic opening OP4222 may overlap each other in a plan view. The number of the first inorganic opening OP4221 may correspond to the number of second inorganic opening OP4222. For example, in a cross-sectional view, widths of the first inorganic opening OP4221 and the second inorganic opening OP4222 may be substantially identical to each other. In a plan view, shapes of the first inorganic opening OP4221 and the second inorganic opening OP4222 may be substantially identical to each other.

FIGS. 21 to 29 are schematic cross-sectional views of the mask assembly MA for illustrating a method of manufacturing the display device 2 according to another embodiment.

In FIGS. 21 to 29, same reference numerals as those of FIG. 20 indicate same members, and some of descriptions thereof will not be repeatedly given.

Referring to FIGS. 21 to 29, the method of manufacturing the display device 2 may include arranging the mask assembly MA in the chamber (see, e.g., CH of FIG. 1).

The arranging of the mask assembly MA may include disposing a stopping layer 421 in which the stopping layer opening OP421 is arranged, on the first mask layer 41, disposing the inorganic layer 422 on the stopping layer 421, forming the first mask opening OP41 in the first mask layer 41, and etching the inorganic layer 422 overlapping the stopping layer opening OP421 in a plan view.

Figure 21:
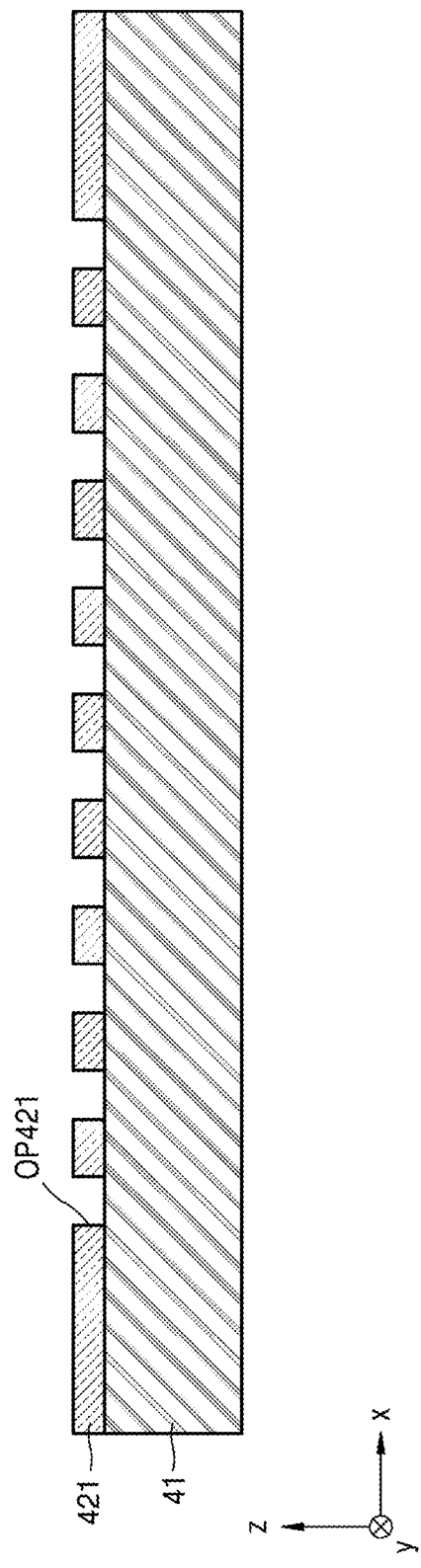

FIG. 21 illustrates the disposing of the stopping layer 421 in which the stopping layer opening OP421 is arranged, on the first mask layer 41. As the process has been described above with reference to FIGS. 4 to 7, description thereof will not be repeatedly given.

Figure 22:
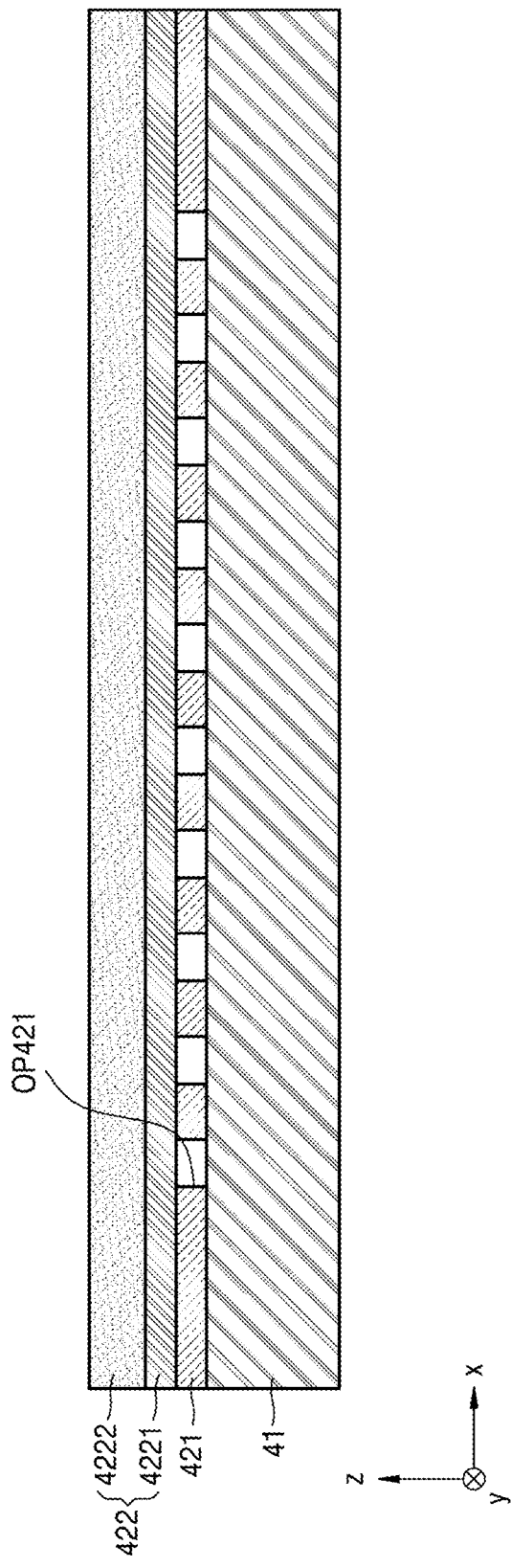

FIG. 22 illustrates the disposing of the inorganic layer 422 on the stopping layer 421. The disposing of the inorganic layer 422 may include disposing the first inorganic layer 4221 on the stopping layer 421 and disposing the second inorganic layer 4222 on the first inorganic layer 4221. In this process, the stopping layer 421 may be disposed on the first mask layer 41, the first inorganic layer 4221 may be disposed on the stopping layer 421, and the second inorganic layer 4222 may be disposed on the first inorganic layer 4221. The etching selectivity ratio of the second inorganic layer 4222 may be greater than the etching selectivity ratio of the first inorganic layer 4221. The etching selectivity ratio of the first inorganic layer 4221 may be less than the etching selectivity of the second inorganic layer 4222.

FIGS. 23 to 26 illustrate the forming of the first mask opening OP41 in the first mask layer 41.

Figure 23:
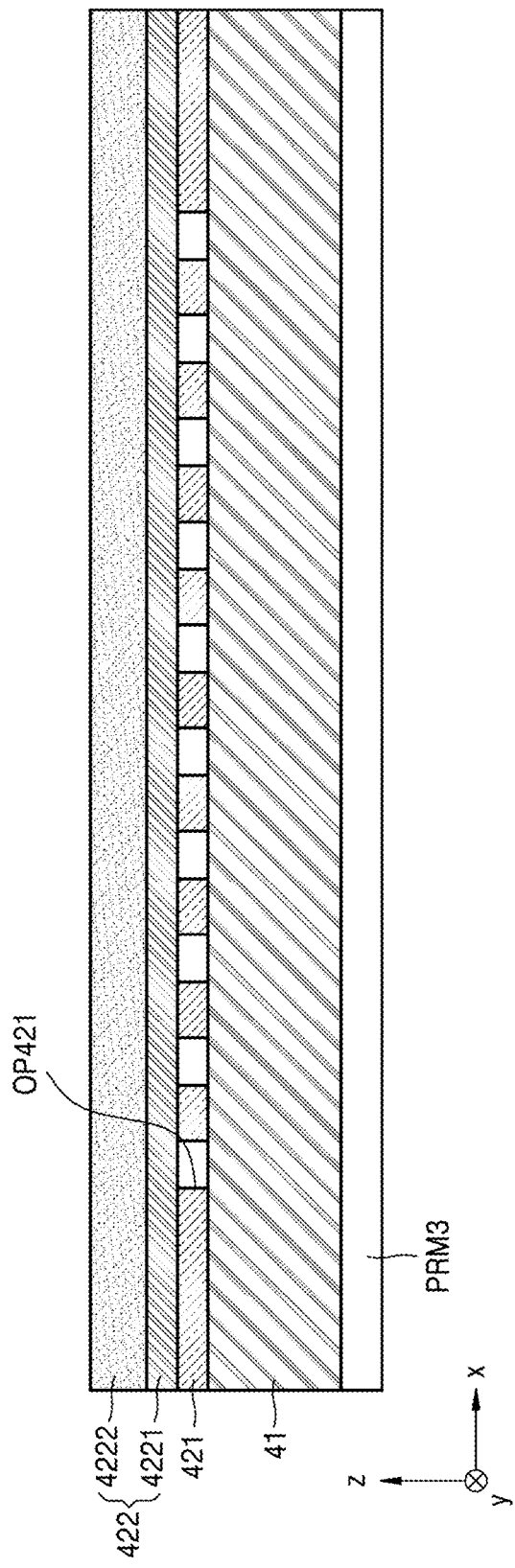
Figure 24:
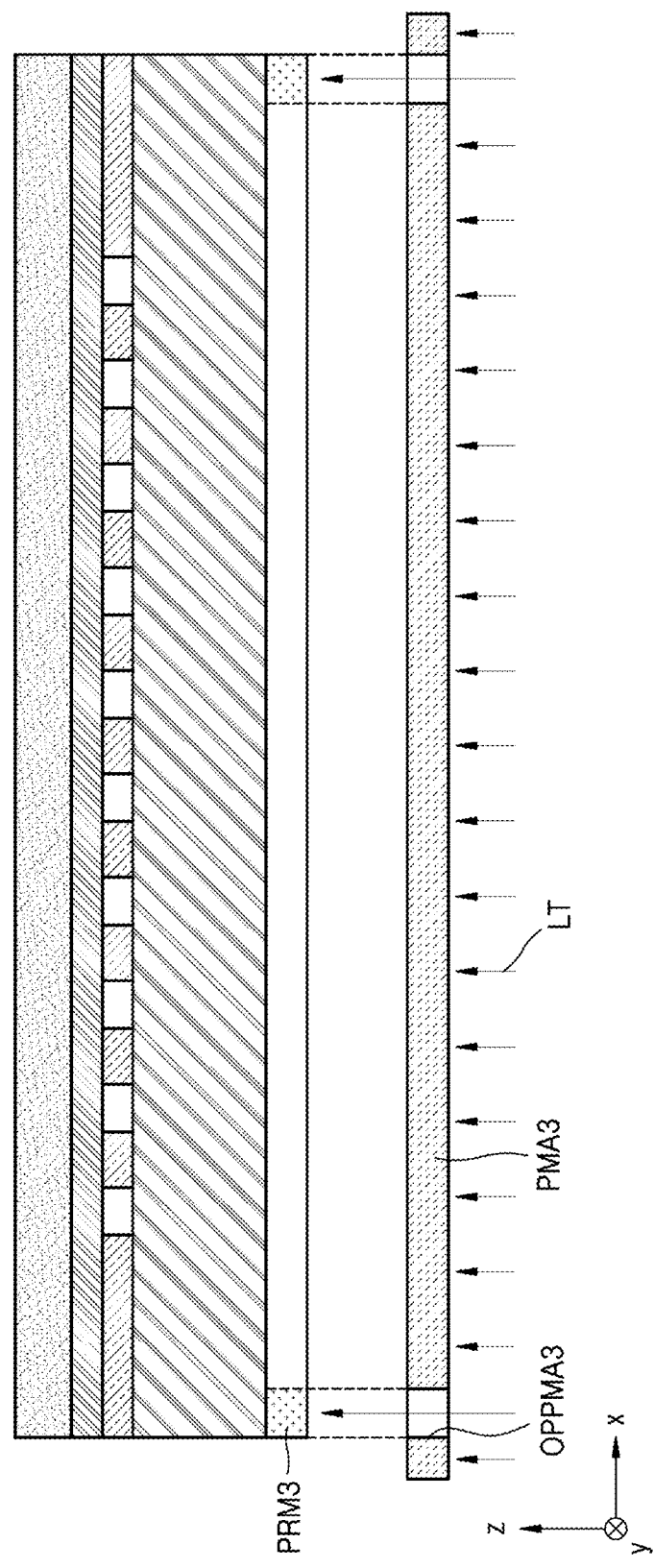
Figure 25:
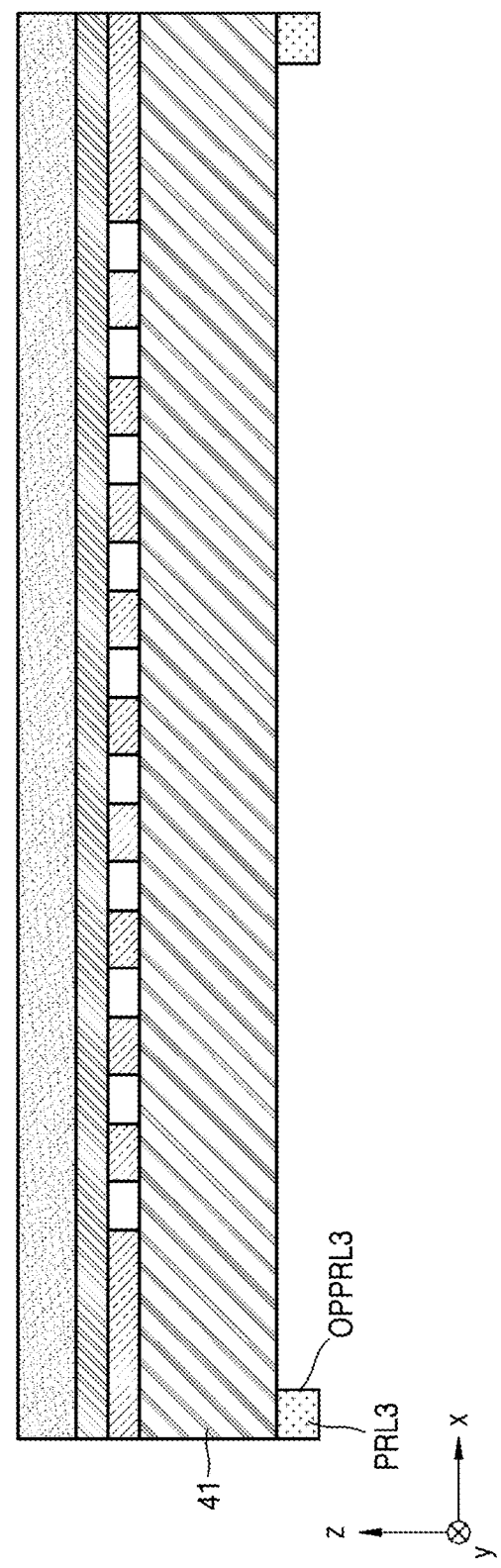

Referring to FIGS. 23 to 25, the forming of the first mask opening OP41 in the first mask layer 41 may include arranging the second photoresist layer PRL2 in which the second photo opening OPPRL2 is arranged (or formed), under the first mask layer 41. The second photoresist layer PRL2 may include the second photo opening OPPRL2.

Referring to FIG. 23, the second photoresist material PRM2 may be disposed under the first mask layer 41. The first mask layer 41 may be disposed on the second photoresist material PRM2, the inorganic layer 422 may be disposed on the stopping layer 421, which is disposed of the first mask layer 41.

Referring to FIG. 24, the second photomask PMA2 that has been patterned may be disposed under the second photoresist material PRM2. The second photomask PMA2 may include multiple second photomask openings OPPMA2. The second photomask openings OPPMA2 may be arranged (or formed) in the second photomask PMA2. Light LT may be irradiated from a bottom of the first mask layer 41 toward the second photoresist material PRM2.

A portion of the light LT may pass through (or penetrate) the second photomask opening OPPMA2 and reach the second photoresist material PRM2, and another portion of the light LT may be blocked by the second photomask PMA2 and not reach the second photoresist material PRM2. A portion of the second photoresist material PRM2, which overlaps the second photomask opening OPPMA2 in a plan view, may be cured.

Referring to FIG. 25, a portion of the second photoresist material (see, e.g., PRM2 of FIG. 10), not overlapping the second photomask opening (see, e.g., OPPMA2 of FIG. 10) in a plan view and not cured, may be removed. In a process of the removing of the portion of the second photoresist material (see, e.g., PRM2 of FIG. 10), the second photoresist layer PRL2, in which the second photo opening OPPRL2 is arranged, may be formed. The first mask layer 41 may be exposed from the second photoresist layer PRL2 through the second photo opening OPPRL2.

Figure 26:
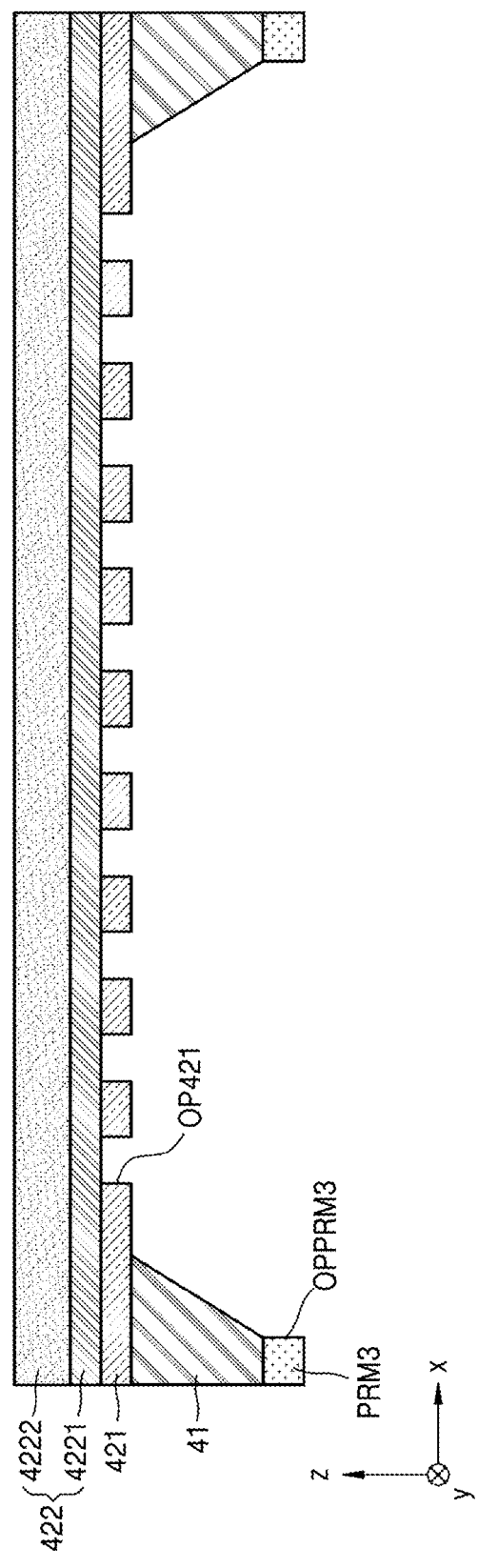

Referring to FIG. 26, the forming of the first mask opening OP41 in the first mask layer 41 may include the etching of the first mask layer 41 overlapping the second photo opening OPPRL2 arranged in the second photoresist layer PRL2 in a plan view. A portion of the first mask layer 41 may be removed through an etching process. For example, the first mask layer 41 may be etched through a dry etching process.

As the first mask layer 41 is etched, the first mask opening OP41 may be arranged in the first mask layer 41. Through the first mask opening OP41, the stopping layer 421 may be exposed from the first mask layer 41. Through the first mask opening OP41 and the stopping layer opening OP421, the inorganic layer 422 may be exposed from the first mask layer 41 and the stopping layer 421.

In a process of the etching of the first mask layer 41, the second inorganic layer 4222 may be not etched due to the first inorganic layer 4221. Due to the etching selectivity ratio of the first inorganic layer 4221 that is relatively low, the first inorganic layer 4221 may be etched by a low degree in the process of the etching of the first mask layer 41. Accordingly, in the process of the etching of the first mask layer 41, uneven etching of the second inorganic layer 4222 having a relatively high etching selectivity ratio may be prevented. For example, a quality of the mask assembly MA may be improved.

Figure 27:
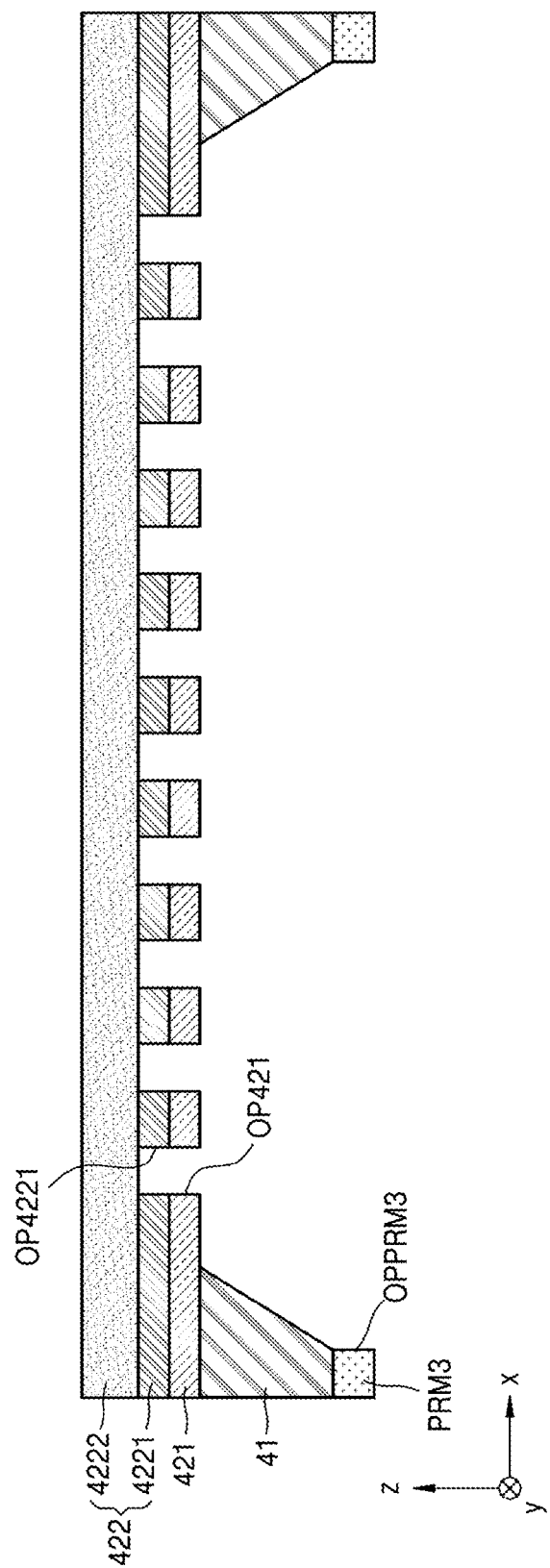
Figure 28:
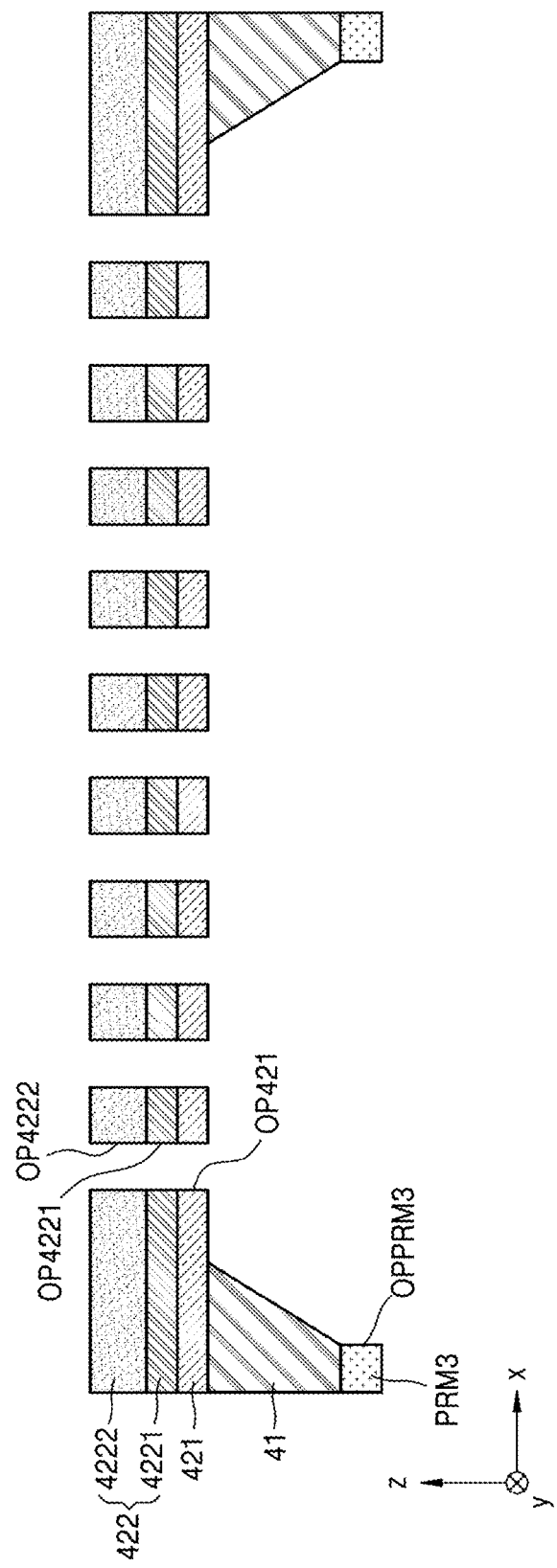

FIGS. 27 and 28 illustrate the etching of the inorganic layer 422.

Referring to FIG. 27, the etching of the inorganic layer 422 may include etching the first inorganic layer 4221 to form the stopping layer opening OP421. A portion of the first inorganic layer 4221 may be removed through an etching process. As described above, for example, the first inorganic layer 4221 may be etched through the dry etching process. The etching of the first inorganic layer 4221 may be performed in a direction in which the stopping layer 421 faces the first inorganic layer 4221 (e.g., the +z-axis direction).

In the process of the etching of the first inorganic layer 4221, the stopping layer 421 may be not etched. In the process of the etching of the first inorganic layer 4221, the stopping layer 421 may function as a mask. For example, the etching gas may pass through the stopping layer opening OP421 and contact the first inorganic layer 4221. In the process of the etching of the first inorganic layer 4221, the first inorganic opening OP4221 may be arranged (or formed) in the first inorganic layer 4221.

Referring to FIG. 28, the etching of the inorganic layer 422 may include etching the second inorganic layer 4222 to form the stopping layer opening OP421. A portion of the second inorganic layer 4222 may be removed through an etching process. For example, the second inorganic layer 4222 may be etched through the dry etching process described above. The etching of the second inorganic layer 4222 may be performed in a direction in which the stopping layer 421 faces the second inorganic layer 4222 (e.g., the +z-axis direction).

In the process of the etching of the second inorganic layer 4222, the stopping layer 421 may be not etched. In the process of the etching of the second inorganic layer 4222, the stopping layer 421 may function as a mask. For example, the etching gas may pass through the stopping layer opening OP421 and contact the second inorganic layer 4222. In the process of the etching of the second inorganic layer 4222, the second inorganic opening OP4222 may be formed in the second inorganic layer 4222.

Referring to FIG. 29, the forming of the first mask opening OP41 in the first mask layer 41 may include the removing of the second photoresist layer PRL2. As the second photoresist layer PRL2 is removed, the mask assembly MA may be manufactured.

According to embodiments, the quality of the apparatus for manufacturing the display device may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of manufacturing a display device, the method comprising:
    arranging a display substrate in a chamber, arranging a mask assembly in the chamber; and
supplying a deposition material to the mask assembly by a deposition source,
wherein the arranging of the mask assembly comprises:
disposing a stopping layer including a stopping layer opening on a first mask layer;
disposing an inorganic layer on the stopping layer;
forming a first mask opening in the first mask layer; and
forming an inorganic opening of the inorganic layer by etching the inorganic layer corresponding to the stopping layer opening.

2. The method of claim 1, wherein, in a plan view, a shape of the stopping layer opening formed in the stopping layer and a shape of the inorganic opening formed in the inorganic layer are identical.

3. The method of claim 1, wherein
the disposing of the inorganic layer comprises:
disposing a first inorganic layer on the stopping layer; and
disposing, on the first inorganic layer, a second inorganic layer having an etching selectivity ratio higher than an etching selectivity ratio of the first inorganic layer, and
the etching of the inorganic layer comprises:
etching the first inorganic layer corresponding to the stopping layer opening; and
etching the second inorganic layer corresponding to the stopping layer opening.

4. The method of claim 3, wherein a number of first inorganic openings formed in the first inorganic layer corresponds to a number of second inorganic openings formed in the second inorganic layer.

5. The method of claim 4, wherein, in a plan view, a shape of the first inorganic openings formed in the first inorganic layer and a shape of the second inorganic openings formed in the second inorganic layer are identical.

6. The method of claim 1, wherein
the disposing of the stopping layer comprises:
disposing, on the first mask layer, a first photoresist layer including a first photo opening;
disposing the stopping layer on the first photoresist layer; and
removing the first photoresist layer.

7. The method of claim 1, wherein
the forming of the first mask opening comprises:
disposing, under the first mask layer, a second photoresist layer including a second photo opening;
etching the first mask layer corresponding to the second photo opening; and
removing the second photoresist layer.

8. The method of claim 7, wherein the etching of the inorganic layer is performed between the etching of the first mask layer and the removing of the second photoresist layer.

9. An apparatus for manufacturing a display device, the apparatus comprising:
a chamber;
a mask assembly arranged in the chamber and facing a display substrate; and
a deposition source arranged in the chamber, facing the mask assembly, and supplying a deposition material that passes through the mask assembly and is deposited on the display substrate, wherein
the mask assembly comprises:
a first mask layer including a first mask opening;
a stopping layer disposed on the first mask layer and including a plurality of stopping layer openings corresponding to the first mask opening; and
an inorganic layer disposed on the stopping layer and including a plurality of inorganic openings corresponding to the plurality of stopping layer openings,
the inorganic layer comprises:
a first inorganic layer; and
a second inorganic layer disposed on the first inorganic layer and having an etching selectivity ratio higher than an etching selectivity ratio of the first inorganic layer, and
the plurality of inorganic openings comprise:
a plurality of first inorganic openings arranged in the first inorganic layer; and
a plurality of second inorganic openings arranged in the second inorganic layer and corresponding to the plurality of first inorganic openings.

10. The apparatus of claim 9, wherein a number of the plurality of first inorganic openings corresponds to a number of the plurality of second inorganic openings.

11. The apparatus of claim 9, wherein, in a plan view, a shape of the plurality of stopping layer openings and a shape of the plurality of inorganic openings are identical.

12. The apparatus of claim 9, wherein, in a plan view, a shape of the plurality of first inorganic openings and a shape of the plurality of second inorganic openings are identical.

* * * * *